United States Patent
Lee et al.

(10) Patent No.: US 7,297,596 B2
(45) Date of Patent: Nov. 20, 2007

(54) METHOD OF MANUFACTURING A SEMICONDUCTOR DEVICE HAVING A SWITCHING FUNCTION

(75) Inventors: Sung-Sam Lee, Gyeonggi-do (KR); Yong-Tae Kim, Gyeonggi-do (KR); Mi-Youn Kim, Gyeonggi-do (KR); Gyo-Young Jin, Seoul (KR); Dae-Won Ha, Seoul (KR); Yun-Gi Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/552,359

(22) Filed: Oct. 24, 2006

(65) Prior Publication Data

US 2007/0108516 A1    May 17, 2007

(30) Foreign Application Priority Data

Nov. 15, 2005    (KR) .................... 10-2005-0109140

(51) Int. Cl.
  *H01L 21/336* (2006.01)
(52) U.S. Cl. ............... 438/259; 438/270; 257/E21.655
(58) Field of Classification Search ............... 438/259, 438/270, 271, 589, E21.655
  See application file for complete search history.

(56) References Cited

U.S. PATENT DOCUMENTS 6,903,428 B2    6/2005   Lee
7,122,431 B2 *  10/2006  Kim et al. .................. 438/259

FOREIGN PATENT DOCUMENTS

KR    10-0199368    3/1999
KR    10-0281128    11/2000

OTHER PUBLICATIONS

English language abstract for Korean Publication No. 10-0199368.
English language abstract for Korean Publication No. 10-0281128.

* cited by examiner

*Primary Examiner*—Hoai Pham
(74) *Attorney, Agent, or Firm*—Marger Johnson & McCollom, P.C.

(57) ABSTRACT

A semiconductor device capable of suppressing void migration is provided. The semiconductor device includes a dummy region extending in a first direction substantially perpendicular to a second direction in which a word line extends. In addition, an isolation layer pattern may not cut the dummy region in the second direction. Consequently, leaning of the dummy region and void migration are prevented. A method of fabricating the semiconductor device is also provided.

13 Claims, 37 Drawing Sheets

FIRST DIRECTION

SECOND DIRECTION

FIG. 4
(PRIOR ART)
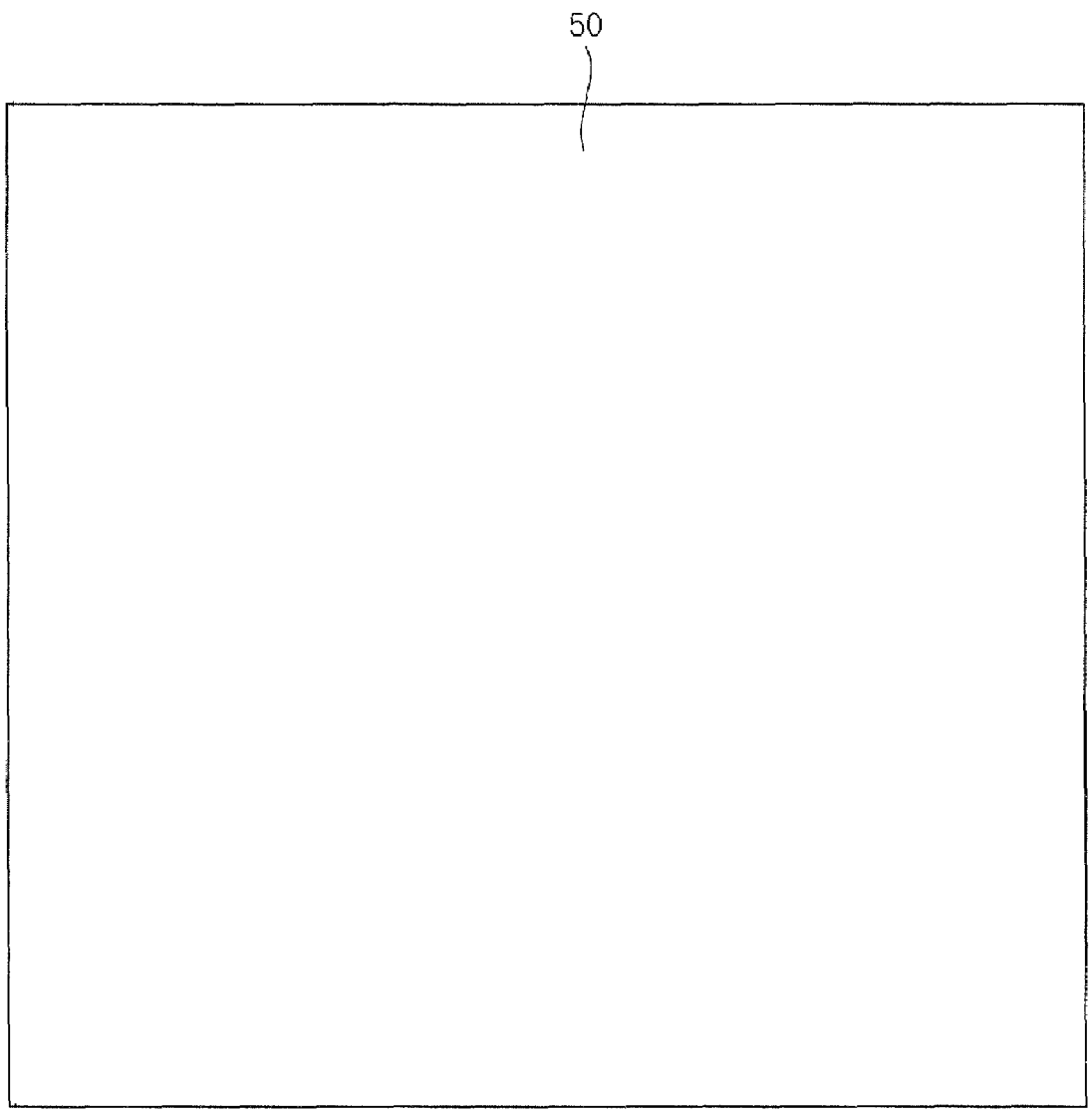
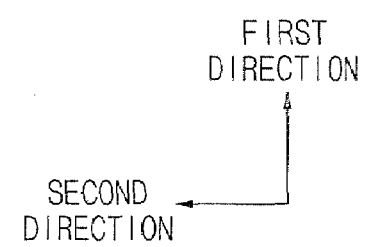

FIG.12
(PRIOR ART)
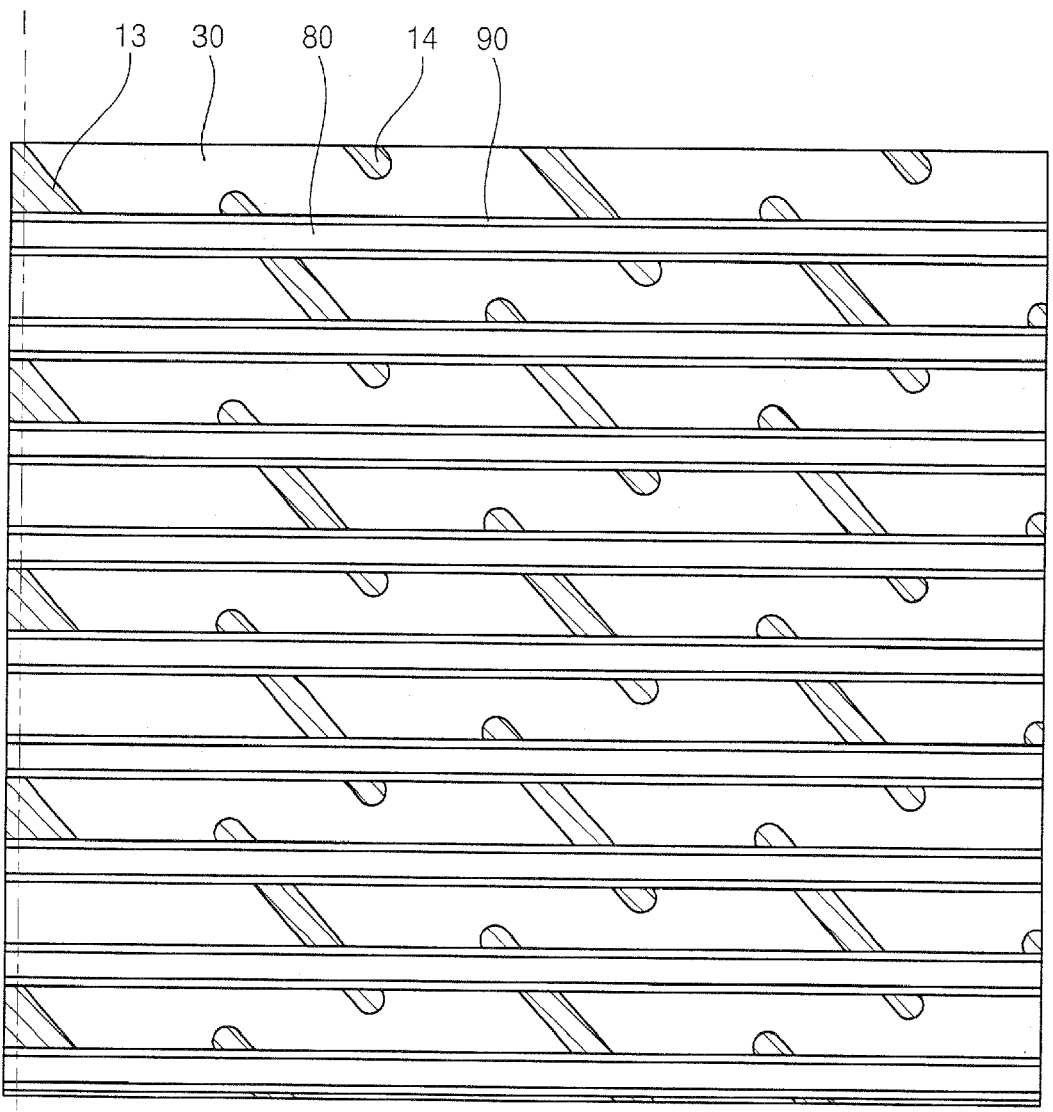
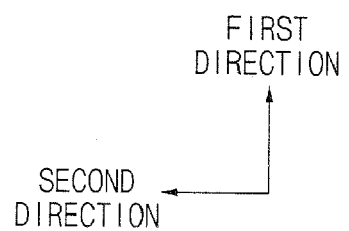

FIG.17
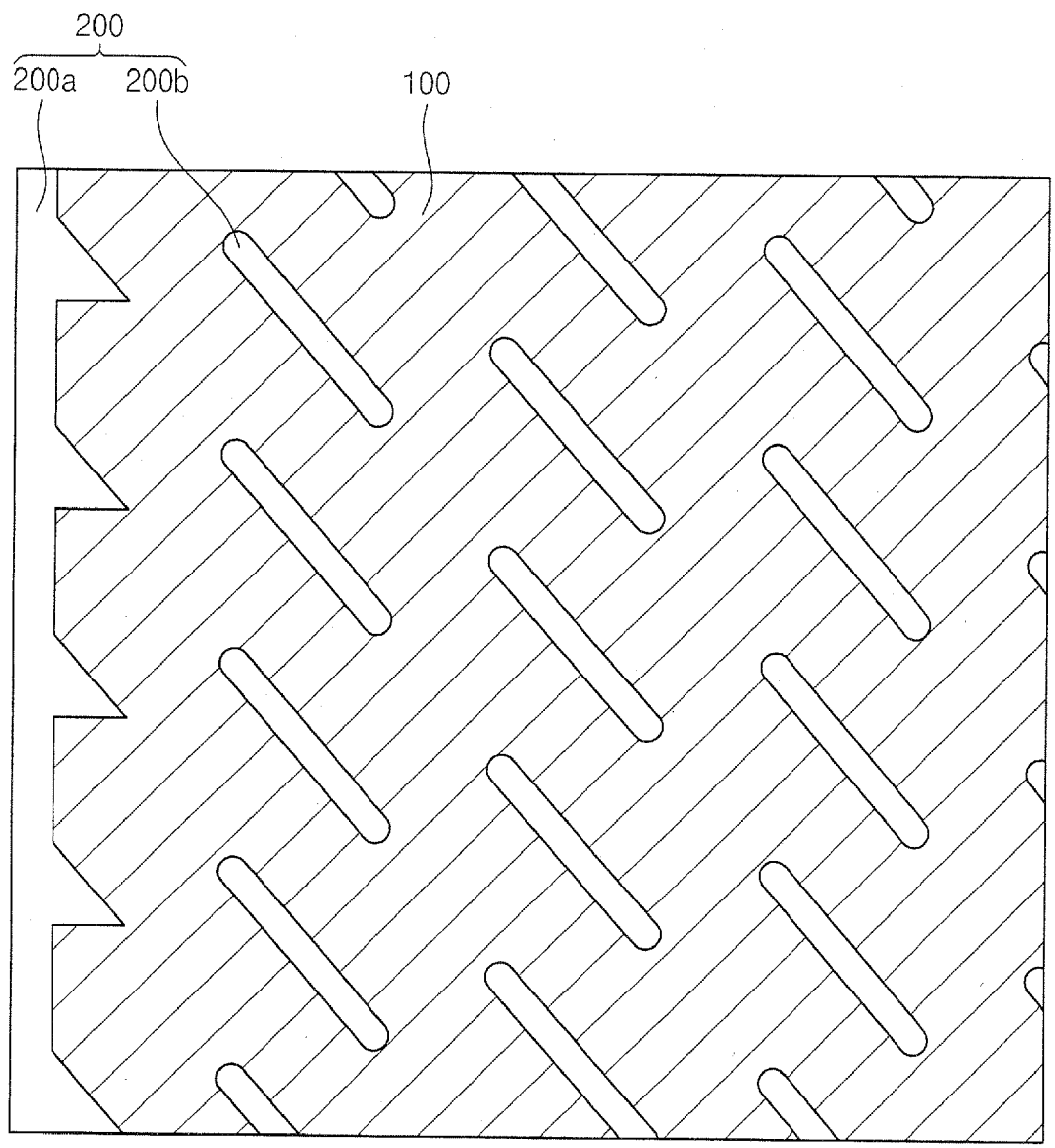
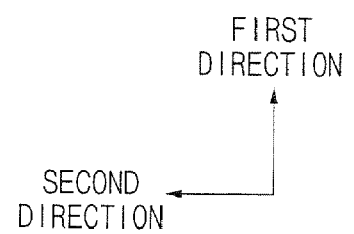

FIG.18
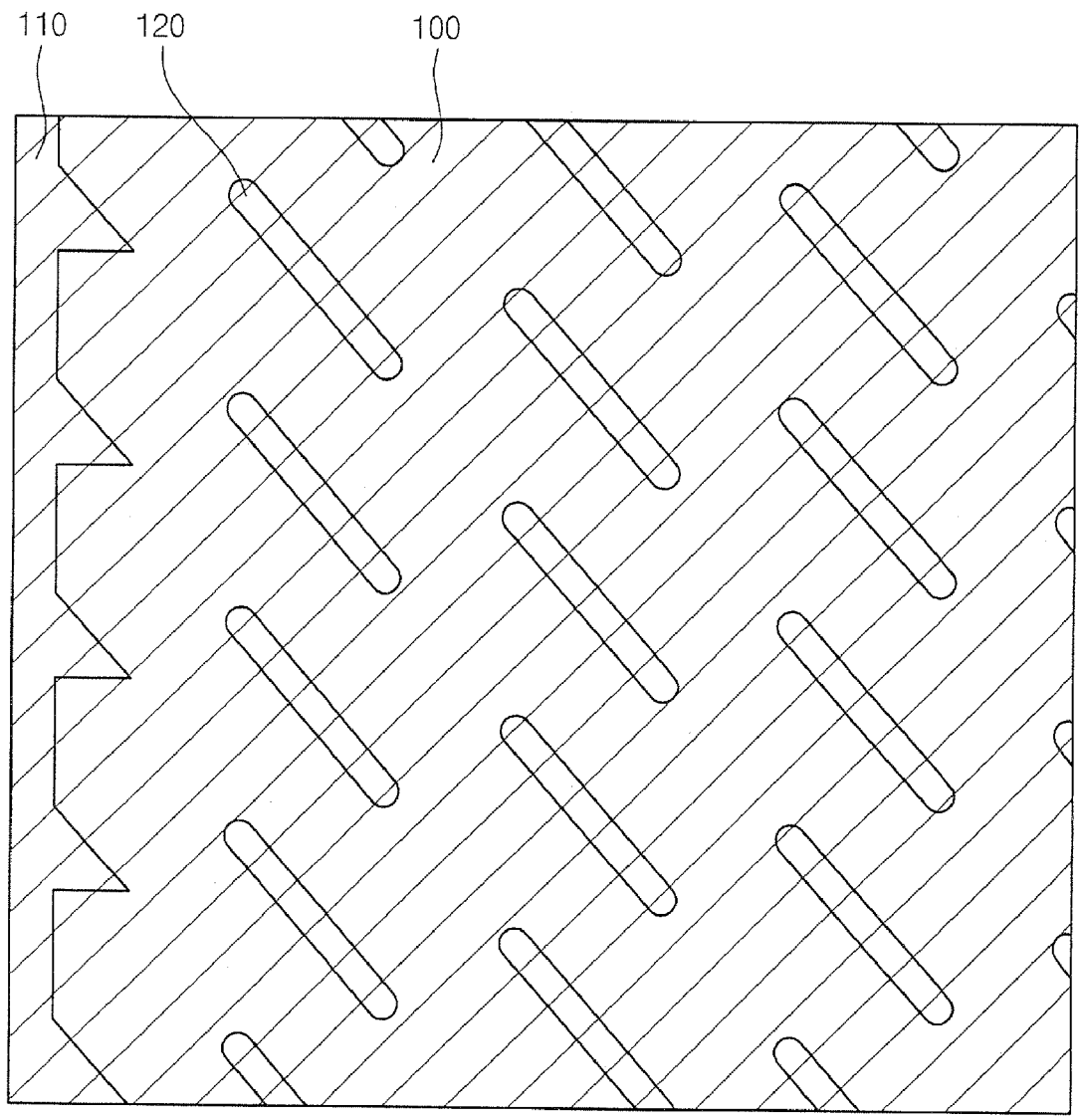
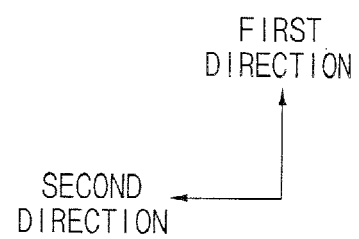

FIG.19
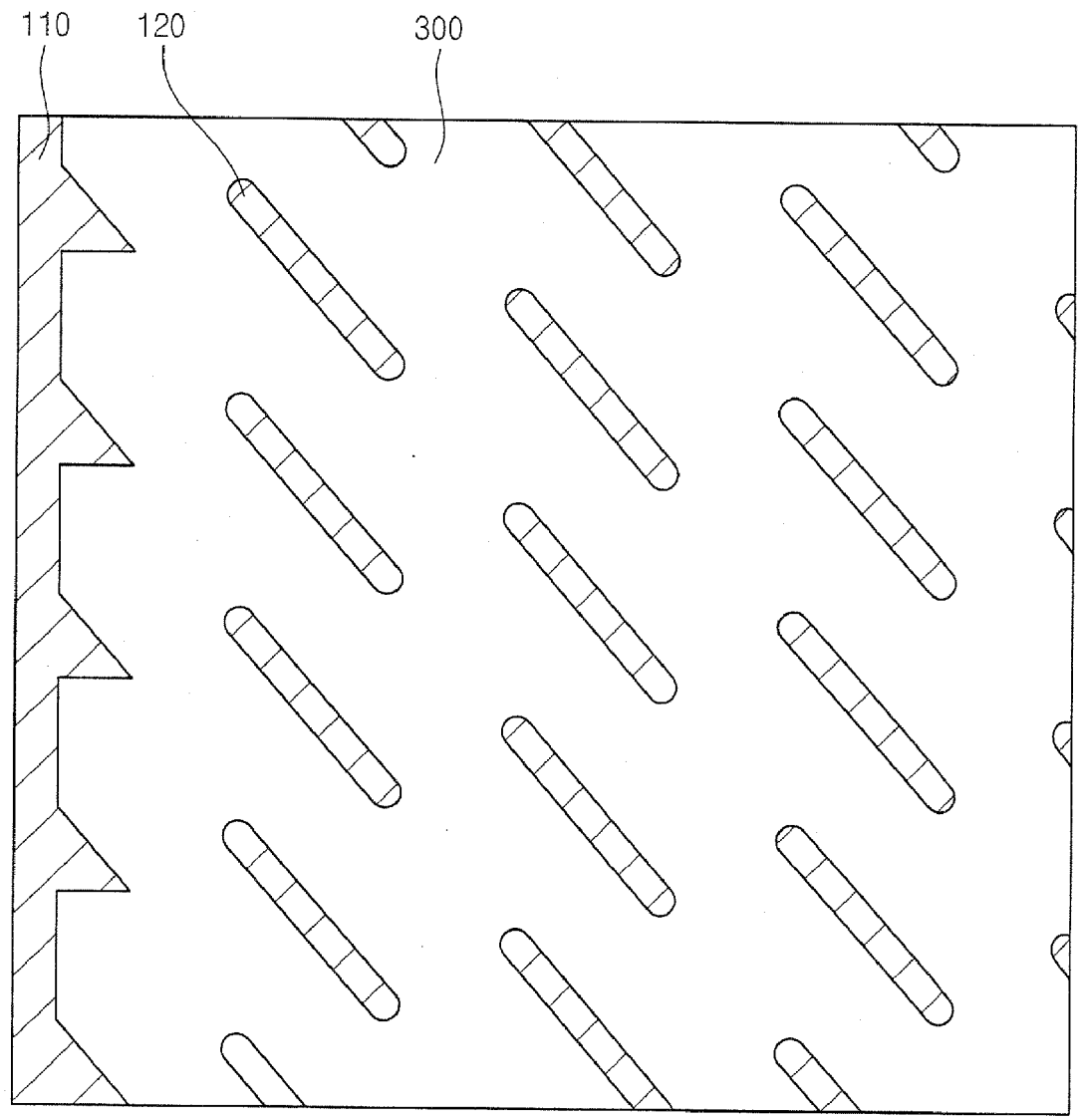
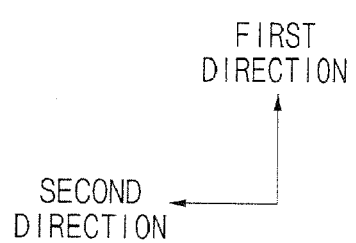

METHOD OF MANUFACTURING A SEMICONDUCTOR DEVICE HAVING A SWITCHING FUNCTION

CROSS-REFERENCE TO RELATED APPLICATION

This application claims priority from Korean Patent Application No. 10-2005-109140, which was filed on 15 Nov. 2005. Korean Patent Application No. 10-2005-109140 is incorporated by reference in its entirety.

BACKGROUND

1. Technical Field

This disclosure relates to a semiconductor device and a method of manufacturing the semiconductor device. More particularly, this disclosure relates to a semiconductor device having a switching function and a method of manufacturing the semiconductor device.

2. Description of the Related Art

FIGS. 1, 2, 4, 6, 8, 10 and 12 are plan views illustrating a conventional method of manufacturing a transistor. FIGS. 3, 5, 7, 9, 11 and 13 are cross-sectional views taken along I-I' lines in FIGS. 2, 4, 6, 8, 10 and 12, respectively.

Referring to FIG. 1, dummy regions 11 and active regions 12 are formed at an upper portion of a semiconductor substrate 10. The dummy regions 11 are arranged in a first direction. However, the dummy regions 11 are not connected to one another in the first direction.

Thereafter, a silicon oxide layer (not shown) is formed on the semiconductor substrate 10 to cover the dummy regions 11 and the active regions 12. A planarization process is then performed on the silicon oxide layer until the dummy regions 11 and the active regions 12 are exposed. Thus, an isolation layer pattern 30 is formed.

The dummy regions 11 may prevent the active regions 12 from easily leaning while the planarization process is performed. However, when the sizes of the dummy regions 11 are relatively small, the dummy regions 11 as well as the active regions 12 may lean while the planarization process is performed.

The isolation layer pattern 30 extends in a second direction substantially perpendicular to the first direction between the dummy regions 11. Thus, the dummy regions 11 are electrically insulated from one another by the isolation layer pattern 30.

Referring to FIGS. 2 and 3, a mask structure 40 is formed on the dummy regions 11, the active regions 12 and the isolation layer pattern 30. The mask structure 40 has first openings 5c partially exposing the dummy regions 11, the active regions 12 and the isolation layer pattern 30. The first openings 5c and the mask structure 40 extend in the second direction. The mask structure 40 includes silicon nitride layer patterns 42 and buffer layer patterns 41. The nitride layer patterns 42 are formed on each of the buffer layer patterns 41.

Thereafter, the dummy regions 11 and the active regions 12 are etched using the mask structure 40 as an etch mask. Thus, first grooves 1c and second grooves (not shown) are formed at upper portions of the dummy regions 11 and upper portions of the active regions 12, respectively. Because the first openings 5c extend in the second direction, the first grooves 1c and the second grooves also extend in the second direction.

As described above, the isolation layer pattern 30 exists between the dummy regions 11. The isolation layer pattern 30 may be minimally etched while the dummy regions 11 and the active regions 12 are etched to form the first grooves 1c and the second grooves. Thus, the sections of the first grooves 1c taken along the line I-I' are substantially asymmetric.

Referring to FIGS. 4 and 5, a silicon oxide layer 50 having a substantially uniform thickness is formed on the mask structure 40, the dummy regions 11, the active regions 12 and the isolation layer pattern 30. Thus, inner faces of the first grooves 1c and the second grooves are covered with the silicon oxide layer 50. Here, the silicon oxide layer 50 may conform to the first grooves 1c and the second grooves.

Referring to FIGS. 6 and 7, an anisotropic etching process is performed on the silicon oxide layer 50 so that portions of the silicon oxide layer 50, the portions being located on bottom faces of the first grooves 1c, bottom faces of the second grooves, the mask structure 40 and the isolation layer pattern 30, may be selectively removed. Thus, silicon oxide layer patterns 51 are formed on sidewalls of the first grooves 1c and the second grooves.

Thereafter, portions of the dummy regions 11 and portions of the active regions 12 that are exposed through the first grooves 1c and the second grooves, respectively, are isotropically etched using the mask structure 40 and the silicon oxide layer patterns 51 together as an etch mask. Thus, third grooves 3c communicated with the first grooves 1c are formed under the first grooves 1c. The third grooves 3c extend in the second direction. In addition, fourth grooves (not shown) communicated with the second grooves are formed under the second grooves. The fourth grooves also extend in the second direction.

As illustrated in FIG. 7, the isolation layer pattern 30 is formed between the dummy regions 11. Thus, the sections of the third grooves 3c taken along the first direction are not substantially circular shapes even though the third grooves 3c are formed by an isotropic etching process. That is, the sections of the third grooves 3c taken along the first direction are substantially asymmetric.

Referring to FIGS. 8 and 9, the mask structure 40 and the silicon oxide layer patterns 51 are removed. Thereafter, a gate oxide layer 60 including silicon oxide is formed on faces of the active regions 12 and the dummy regions 11, the faces being exposed by the isolation layer pattern 30. The gate oxide layer 60 has a substantially uniform thickness. Thus, inner faces of the first grooves 1c, the second grooves, the third grooves 3c and the fourth grooves are covered with the gate oxide layer 60.

Thereafter, a gate electrode layer 70 including a first portion 70a and second portions 70b is formed on the gate oxide layer 60 and the isolation layer pattern 30. The first portion 70a fills the first grooves 1c and the second grooves that have been partially filled with the gate oxide layer 60. The second portions 70b fill the third grooves 3c and fourth grooves that have been partially filled with the gate oxide layer 60. The second portions 70b have voids 5d.

As described above, the sections of the third grooves 3c taken along the first direction are not substantially circular shapes. Thus, the voids 5d generated in the second portions 70b while the gate electrode layer 70 fills up the third grooves 3c may easily migrate from the centers of the second portions 70b. That is, a void migration may be generated so that failure of a semiconductor device may occur.

Gate mask layer patterns 80 are formed on the gate electrode layer 70. Second openings 6c are defined between the gate mask layer patterns 80. The gate electrode layer 70 is partially exposed through the second openings 6c. The second openings 6c and the gate mask layer patterns 80 extend in the second direction. Here, the gate mask layer patterns 80 correspond to word lines.

Referring to FIGS. 10 and 11, the gate electrode layer 70 and the gate oxide layers 60 are subsequently etched using the gate mask layer patterns 80 as an etch mask. Thus, gate electrodes 71 and gate oxide layer patterns 61 are formed.

Two gate electrodes 71 are formed on each of the active regions 12. In addition, as illustrated in FIG. 11, two gate electrodes 71 are also formed on each of the dummy patterns 11. This is because the dummy regions 11 are separated from one another.

Dummy impurity regions 13 and active impurity regions 14 are formed at upper face portions of the dummy regions 11 and upper face portions of the active regions 12, respectively, by using the gate mask layer patterns 80 and the isolation layer pattern 30 together as an ion implantation mask.

Referring to FIGS. 12 and 13, an insulating layer (not shown) is formed to cover the dummy impurity regions 13, the active impurity regions 14, the isolation layer pattern 30, the gate oxide layer patterns 61, the gate electrodes 71 and the gate mask layer patterns 80.

Thereafter, the insulating layer is anisotropically etched to form spacers 90 on sidewalls of the gate mask layer patterns 80, the gate electrodes 71 and the gate oxide layer patterns 61. Thus, a semiconductor device including the dummy impurity regions 13, the active impurity regions 14, the gate oxide layer patterns 61, the gate electrodes 71, the gate mask layer patterns 80 and the spacers 90 may be fabricated.

As described above, the dummy regions 11 are spaced apart from one another in the first direction. Thus, if the dummy regions 11 are relatively small, the dummy regions 11 may lean or collapse.

In addition, because the isolation layer pattern 30 is formed between the dummy regions 11, the sections of the third grooves 3c taken in the first direction may not be substantially circular shapes even though the third grooves 3c are formed by the isotropic etching process. That is, the sections of the third grooves 3c taken in the first direction may be substantially asymmetric.

Thus, the voids 5d generated in the second portions 70b may easily migrate from the centers of the second portions 70b while the gate electrode layer 70 fills the third grooves 3c. As a result, the voids 5d may cause the failure of a semiconductor device.

SUMMARY

A method of fabricating a semiconductor device includes forming an isolation layer pattern over a dummy region extending in a first direction, forming grooves in a second direction perpendicular to the first direction, forming gate oxide layers on the dummy region and active regions, forming gate electrodes in the grooves having a void, forming gate electrodes and gate oxide layers, and doping impurities into the dummy and active regions exposed by the gate electrode and oxide layers.

BRIEF DESCRIPTION OF THE DRAWINGS

The foregoing and other objects, features and advantages of the invention will be apparent from the more particular description of preferred embodiments of the invention, as illustrated in the accompanying drawings. The drawings are not necessarily to scale, emphasis instead being placed upon illustrating the principles of the invention.

FIGS. 1, 2, 4, 6, 8, 10 and 12 are plan views illustrating a conventional method of manufacturing a transistor.

FIGS. 17, 18, 19, 20, 23, 26, 29, 32 and 35 are plan views illustrating methods of fabricating the semiconductor devices in FIGS. 14 to 16.

DETAILED DESCRIPTION

Figure 1:
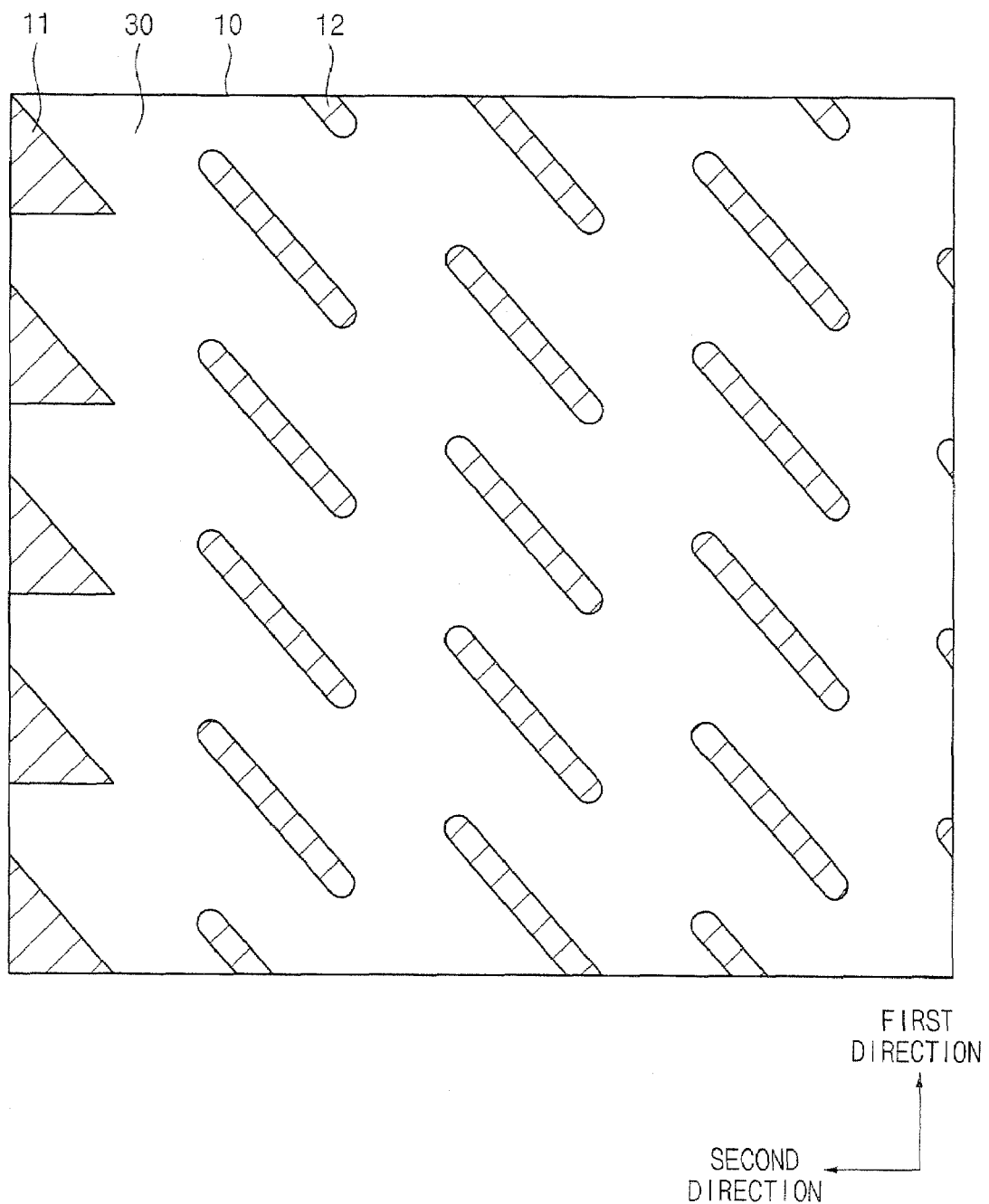
Figure 2:
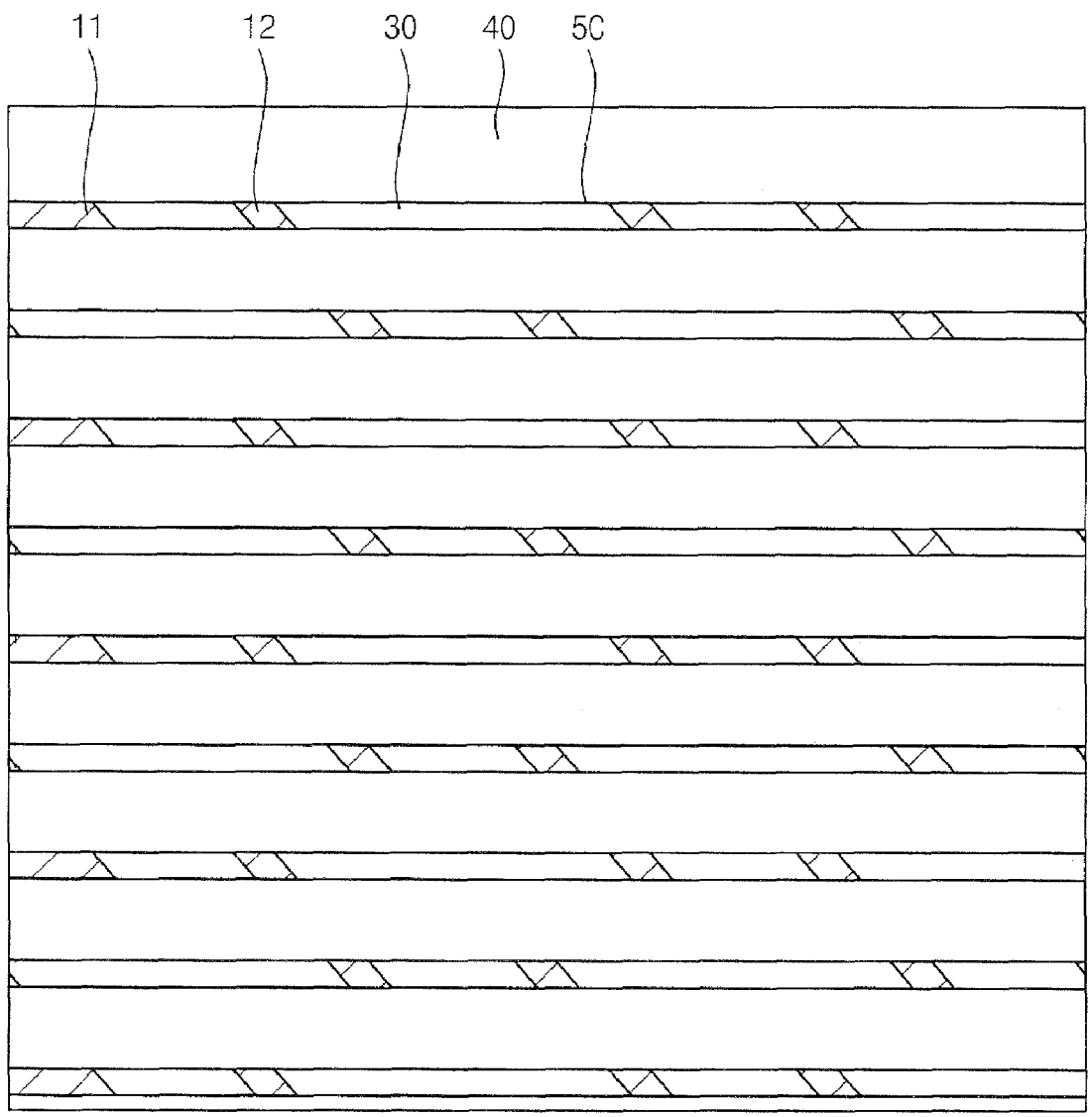
Figure 3:
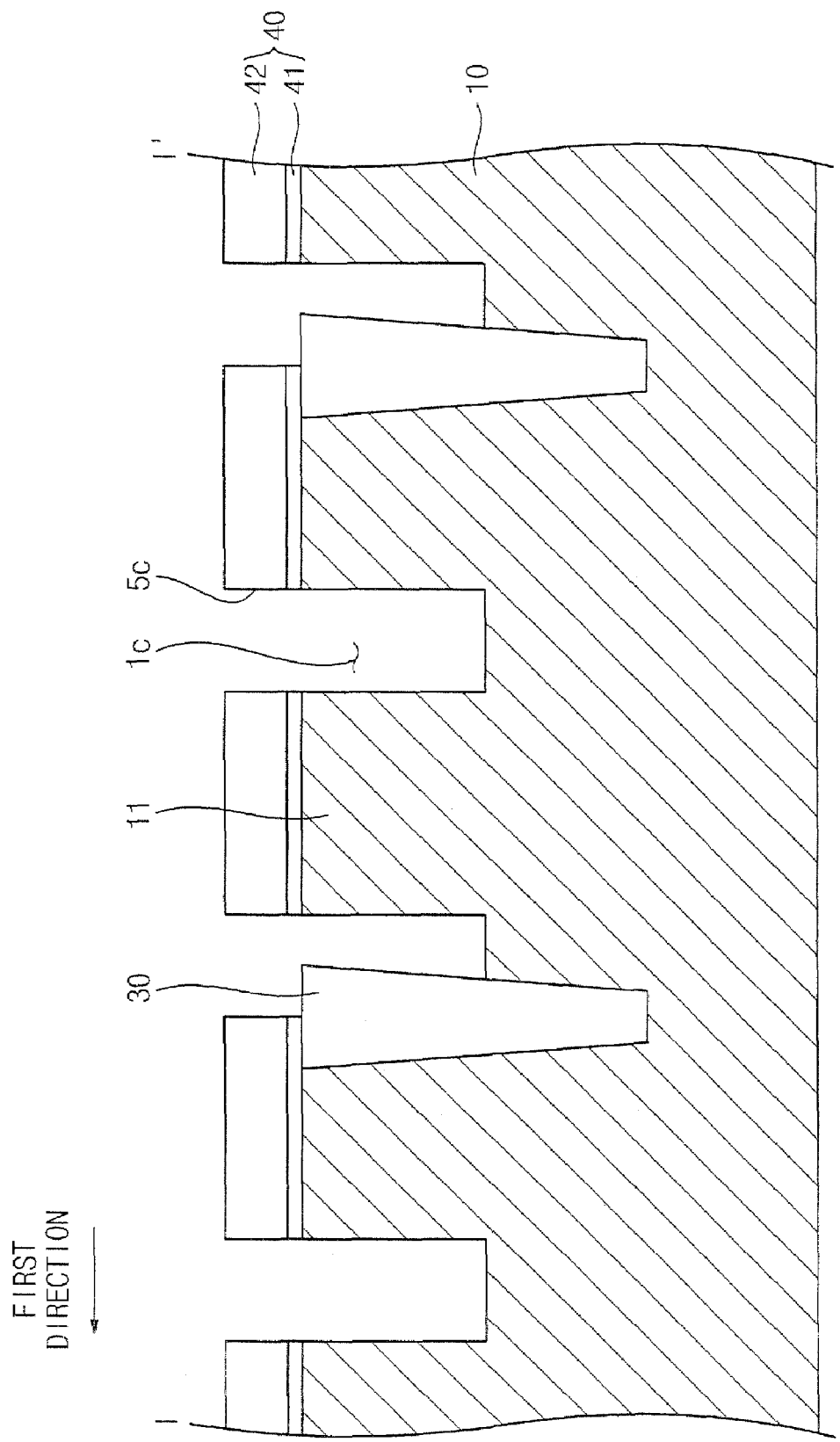
FIGS. 3, 5, 7, 9, 11 and 13 are cross-sectional views taken along I-I' lines in FIGS. 2, 4, 6, 8, 10 and 12, respectively.
Figure 5:
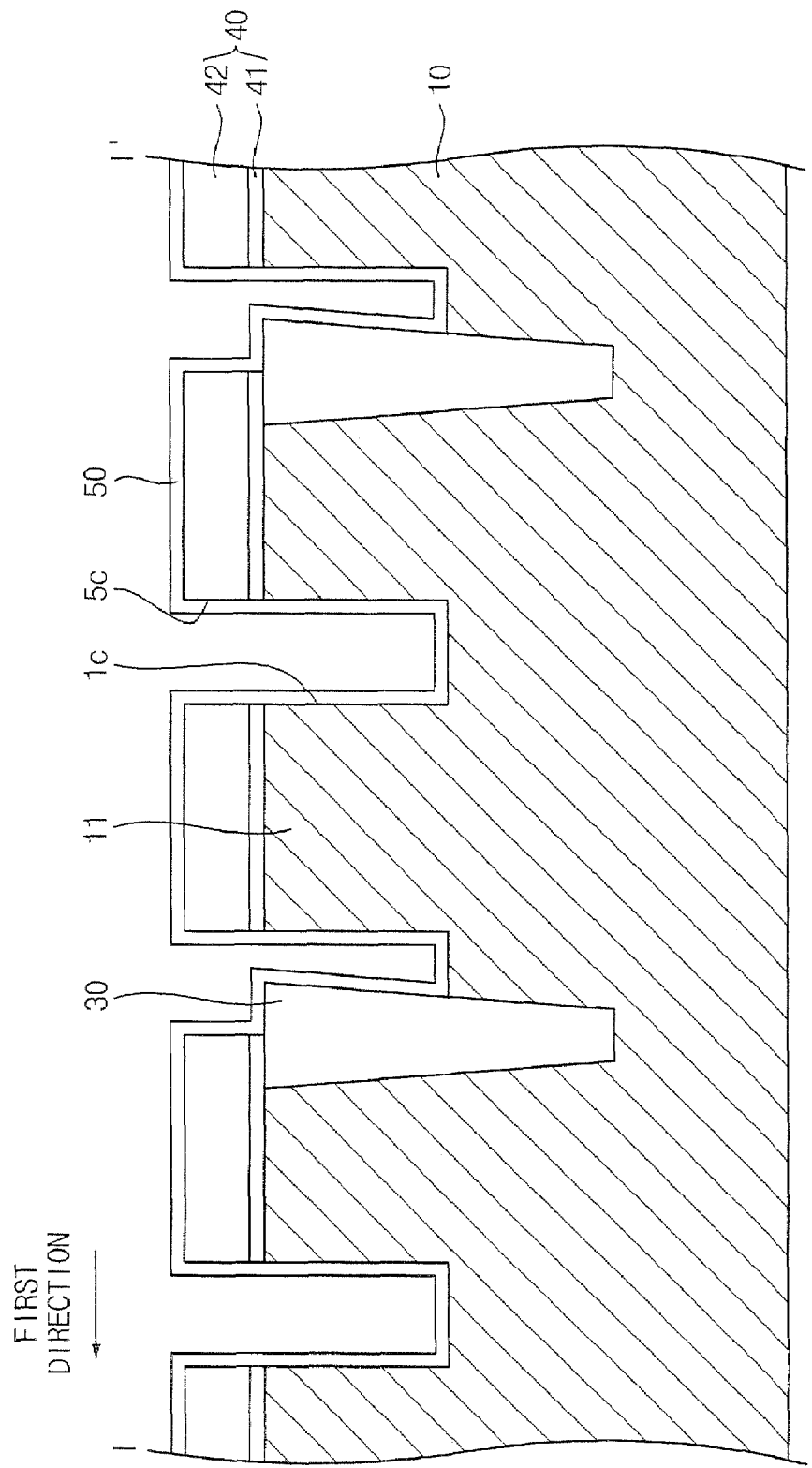
Figure 6:
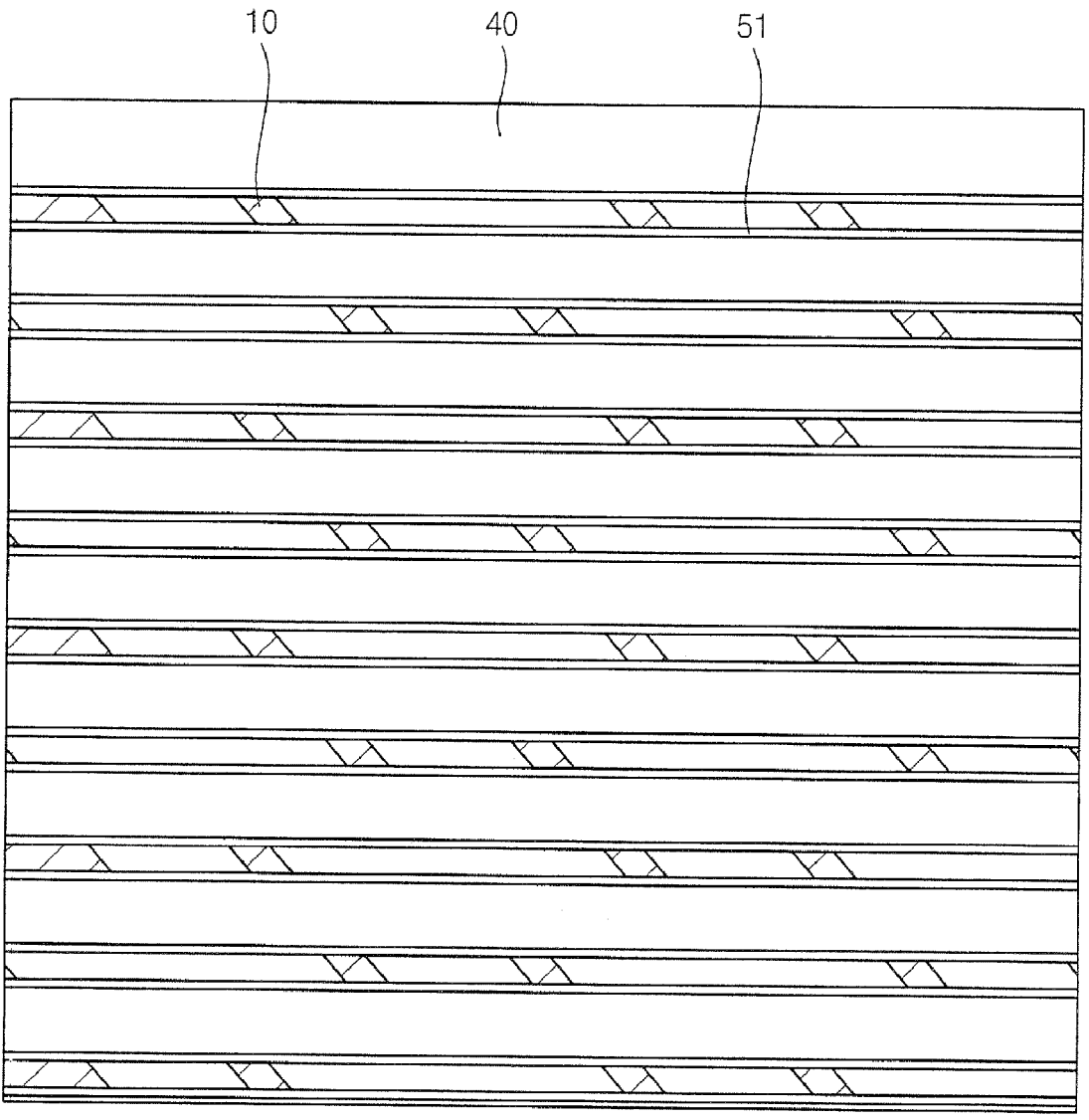
Figure 7:
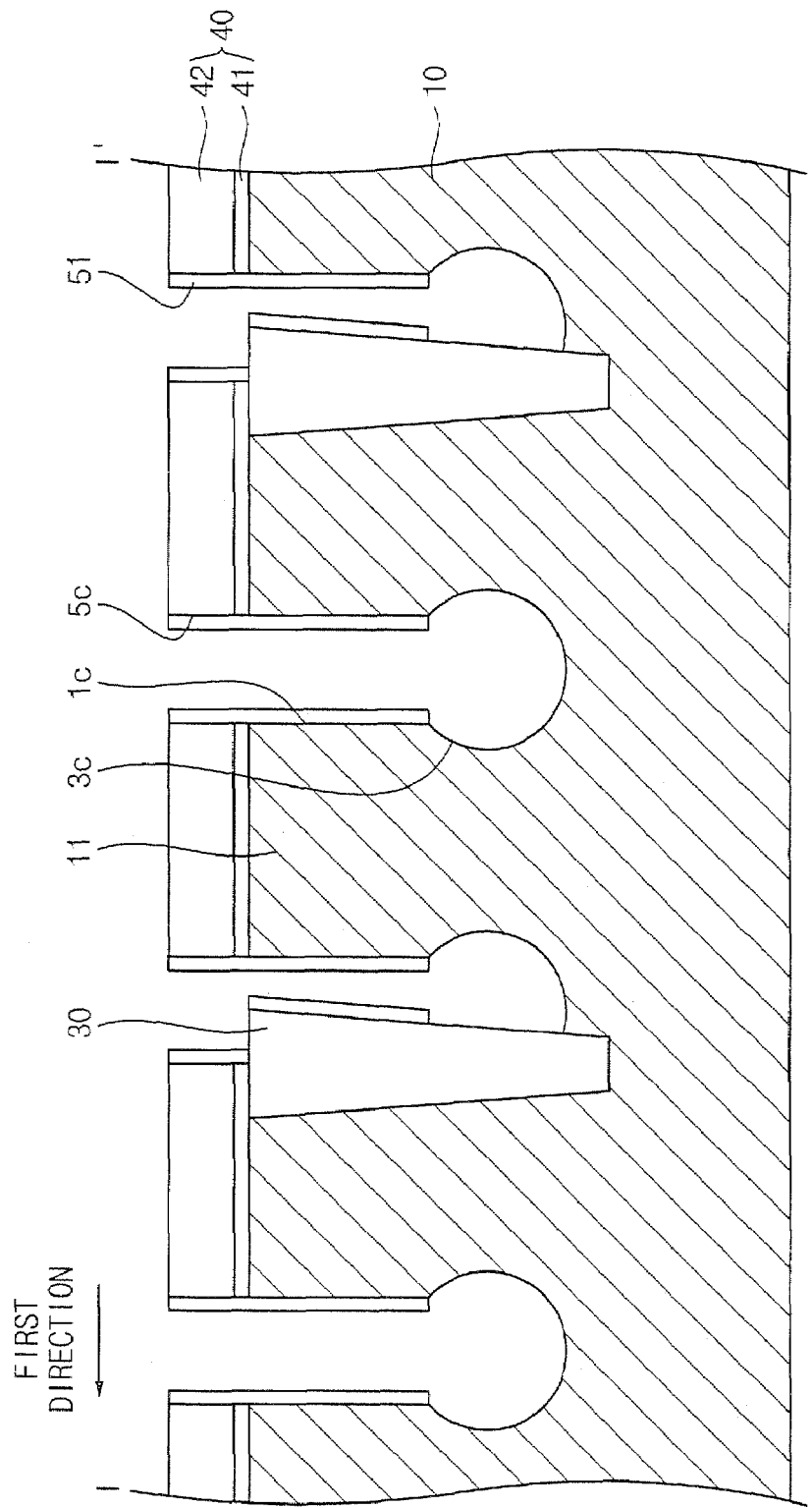
Figure 8:
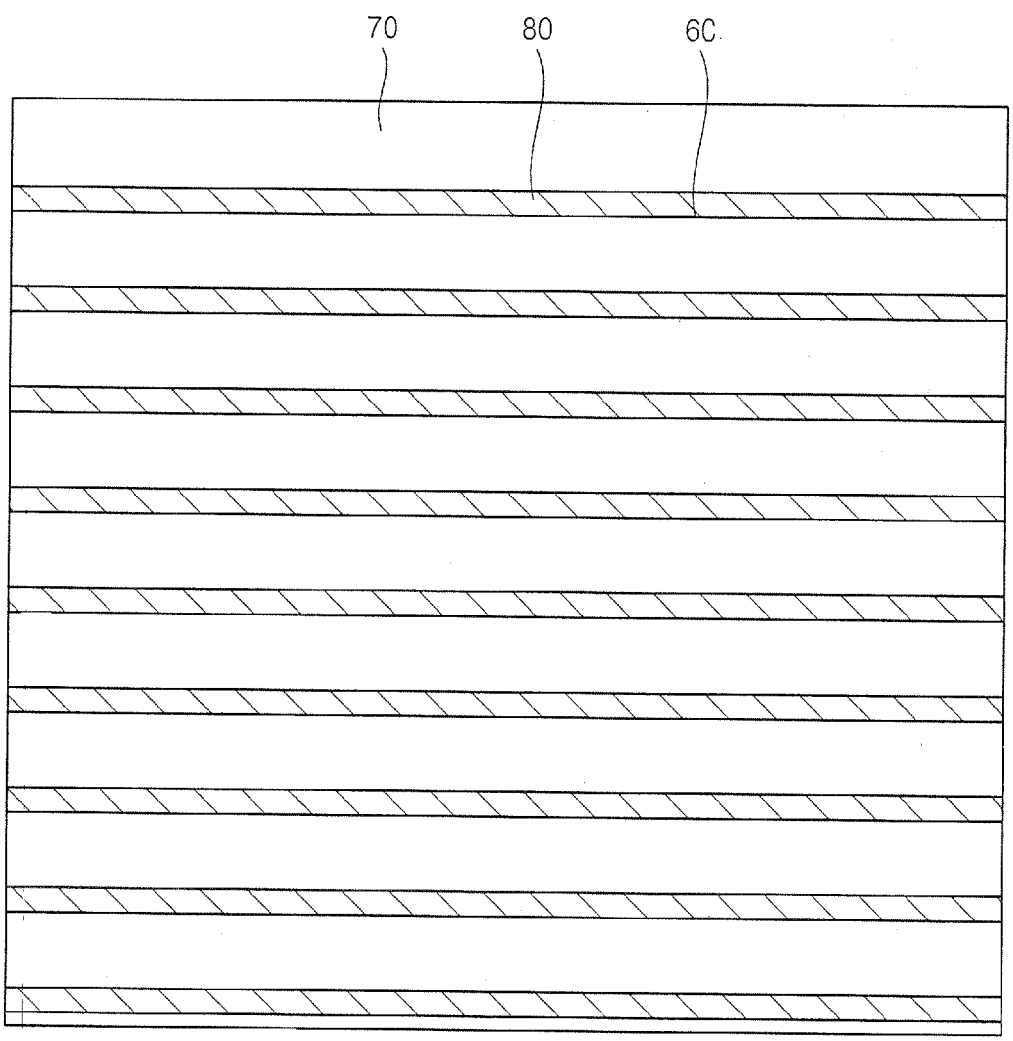
Figure 9:
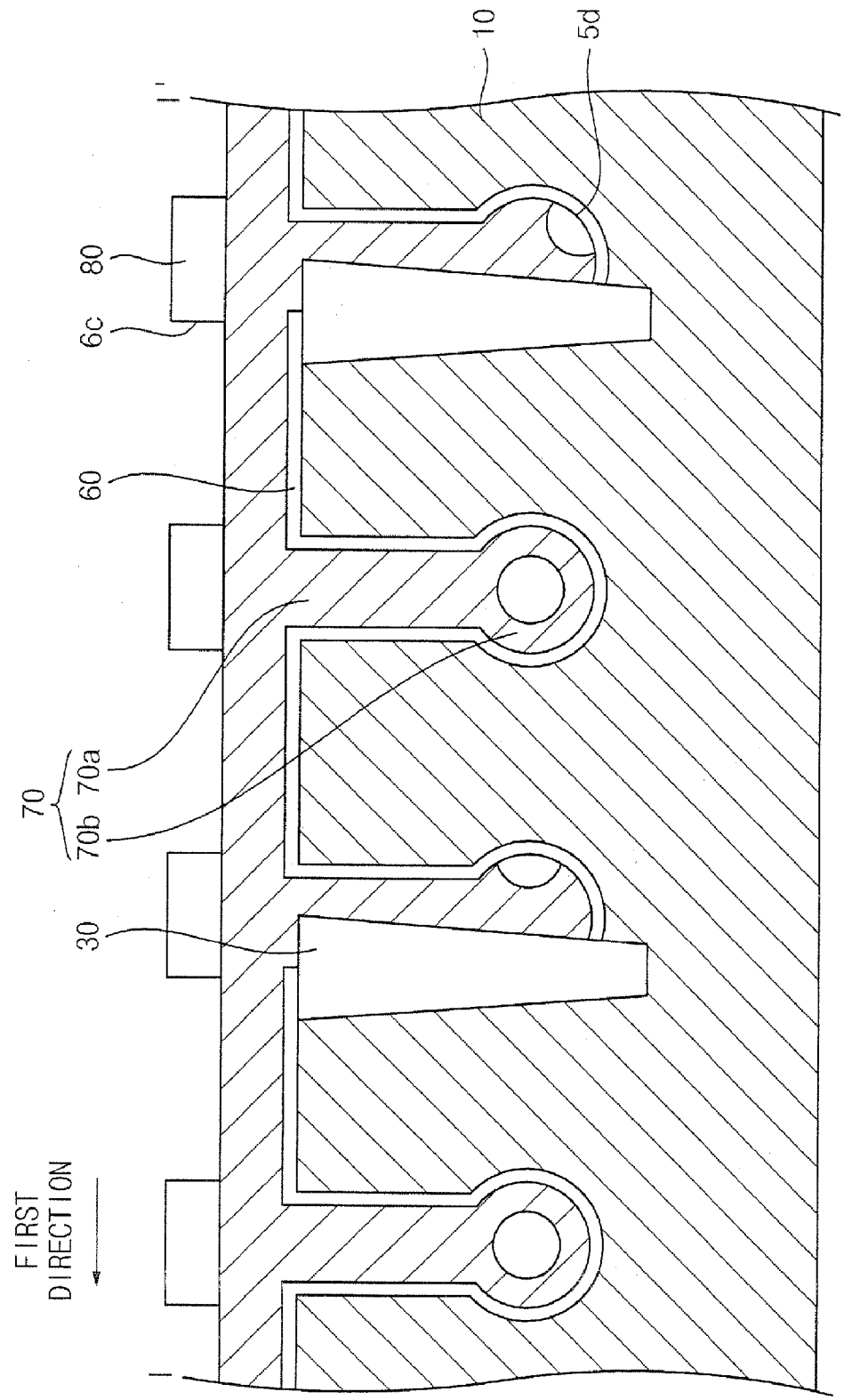
Figure 10:
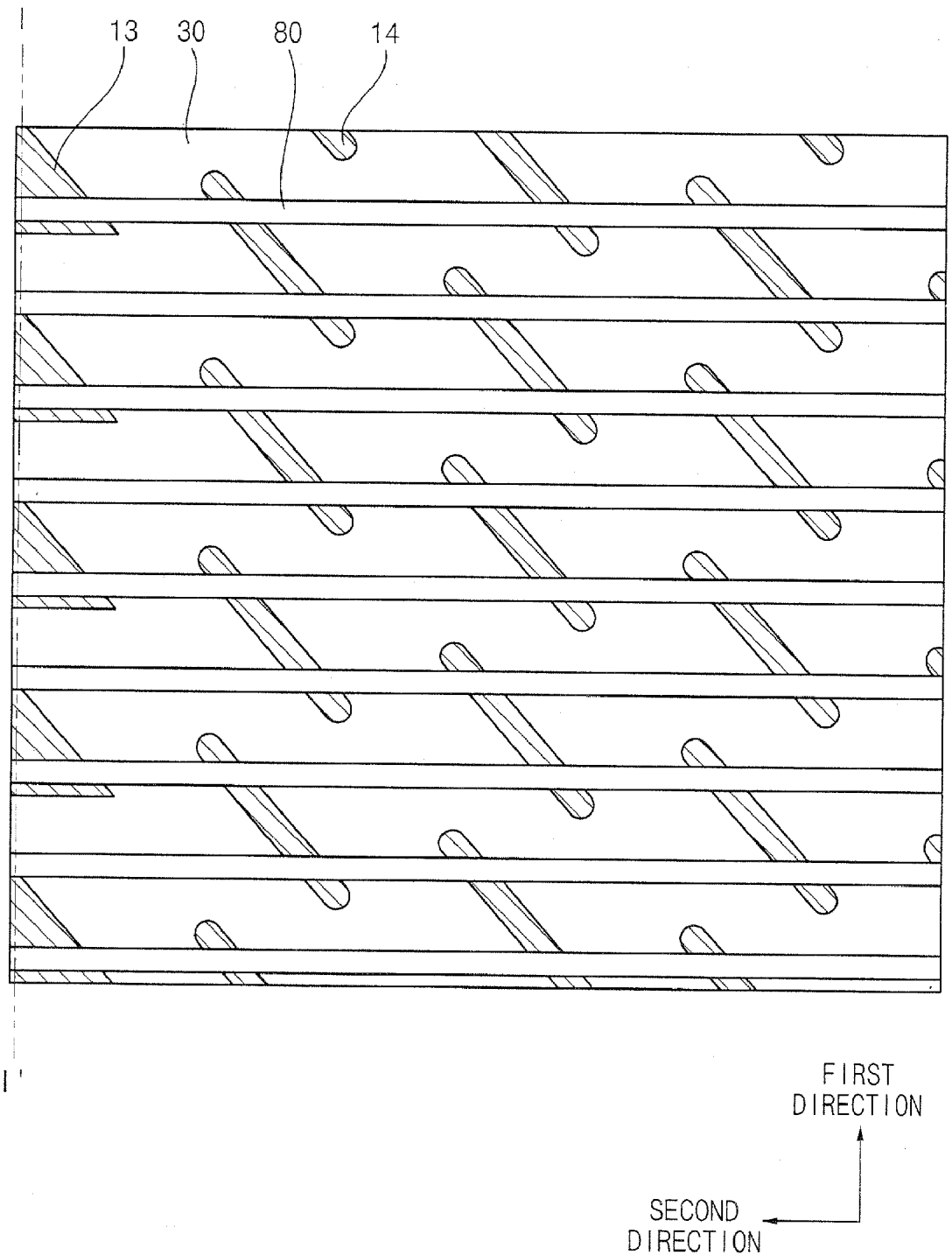
Figure 11:
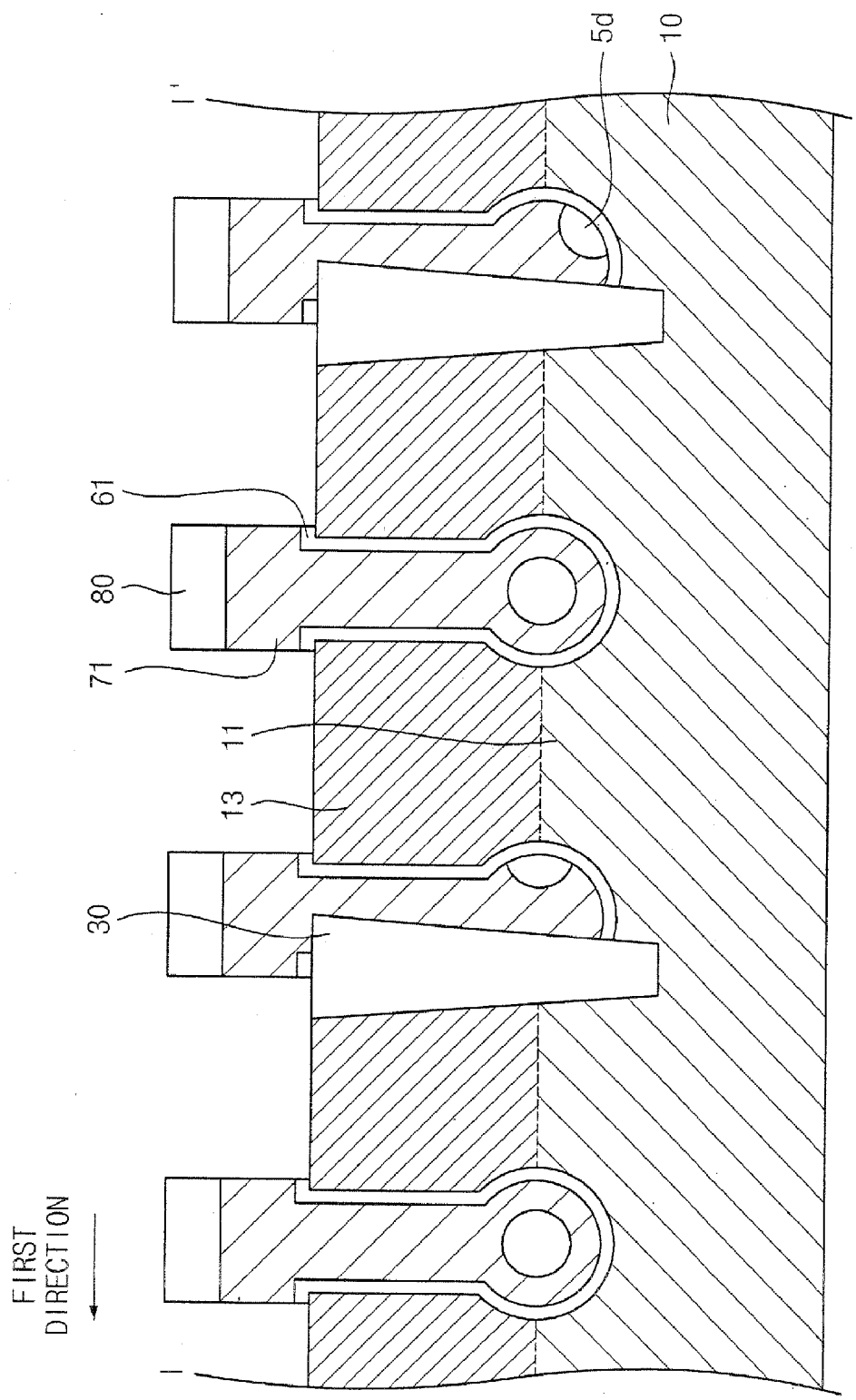
Figure 13:
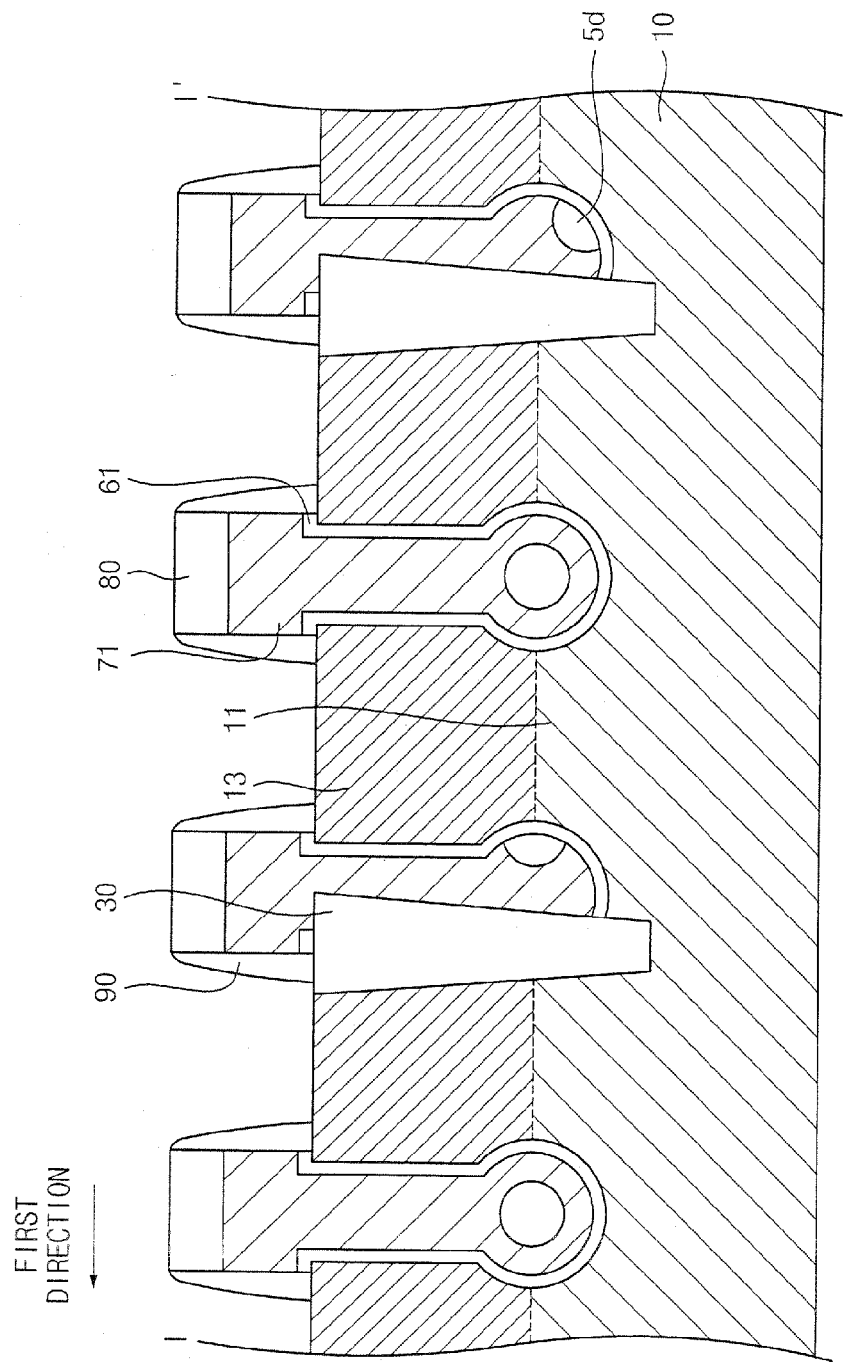

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure is thorough and complete, and fully conveys the inventive principles found in embodiments of the invention to those skilled in the art. In the drawings, the size and relative sizes of layers and regions may be exaggerated for clarity. The drawings are not to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the invention are described with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the invention.

Figure 14:
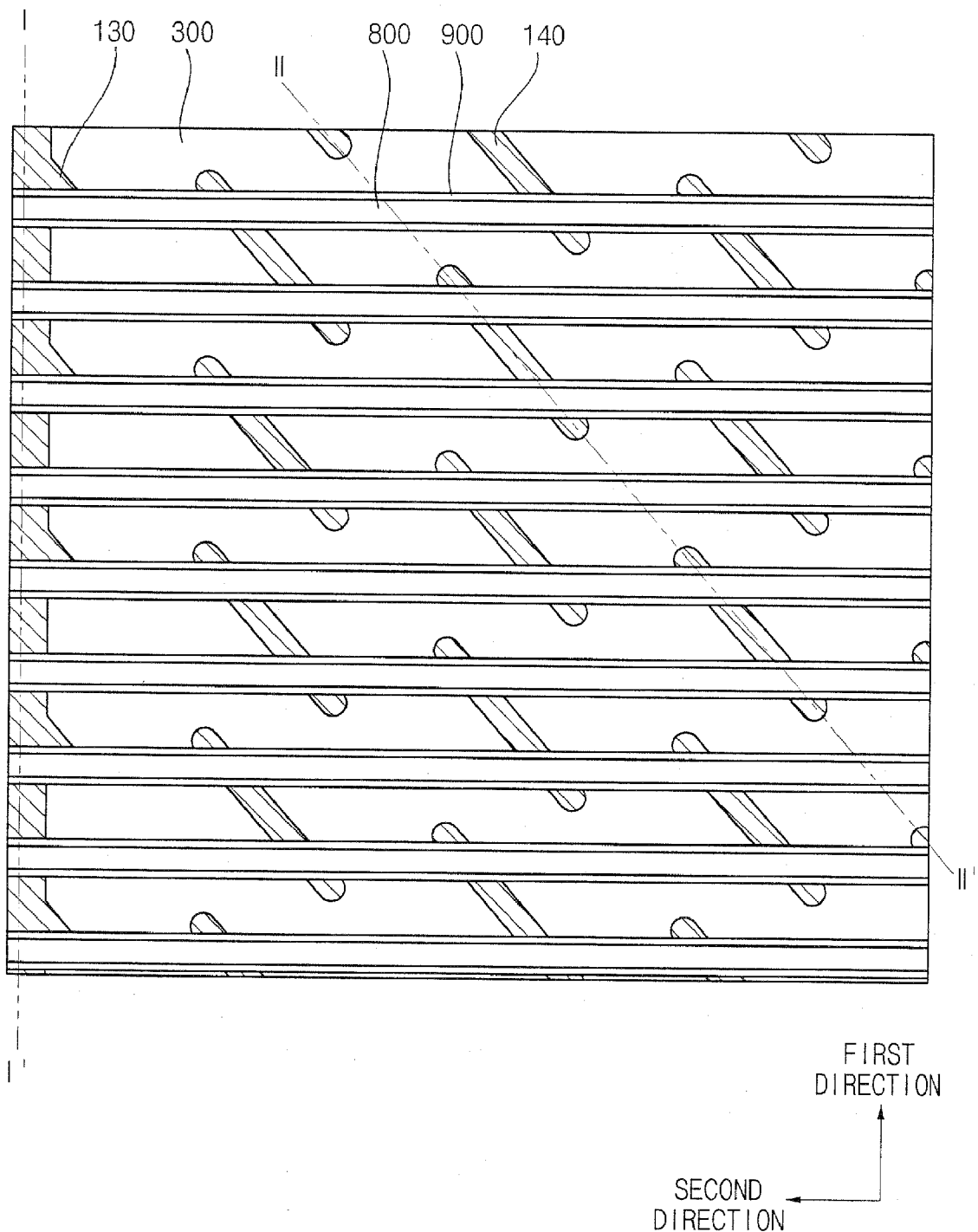
FIG. 14 is a plan view illustrating semiconductor devices in accordance with some embodiments of the invention.
Figure 15:
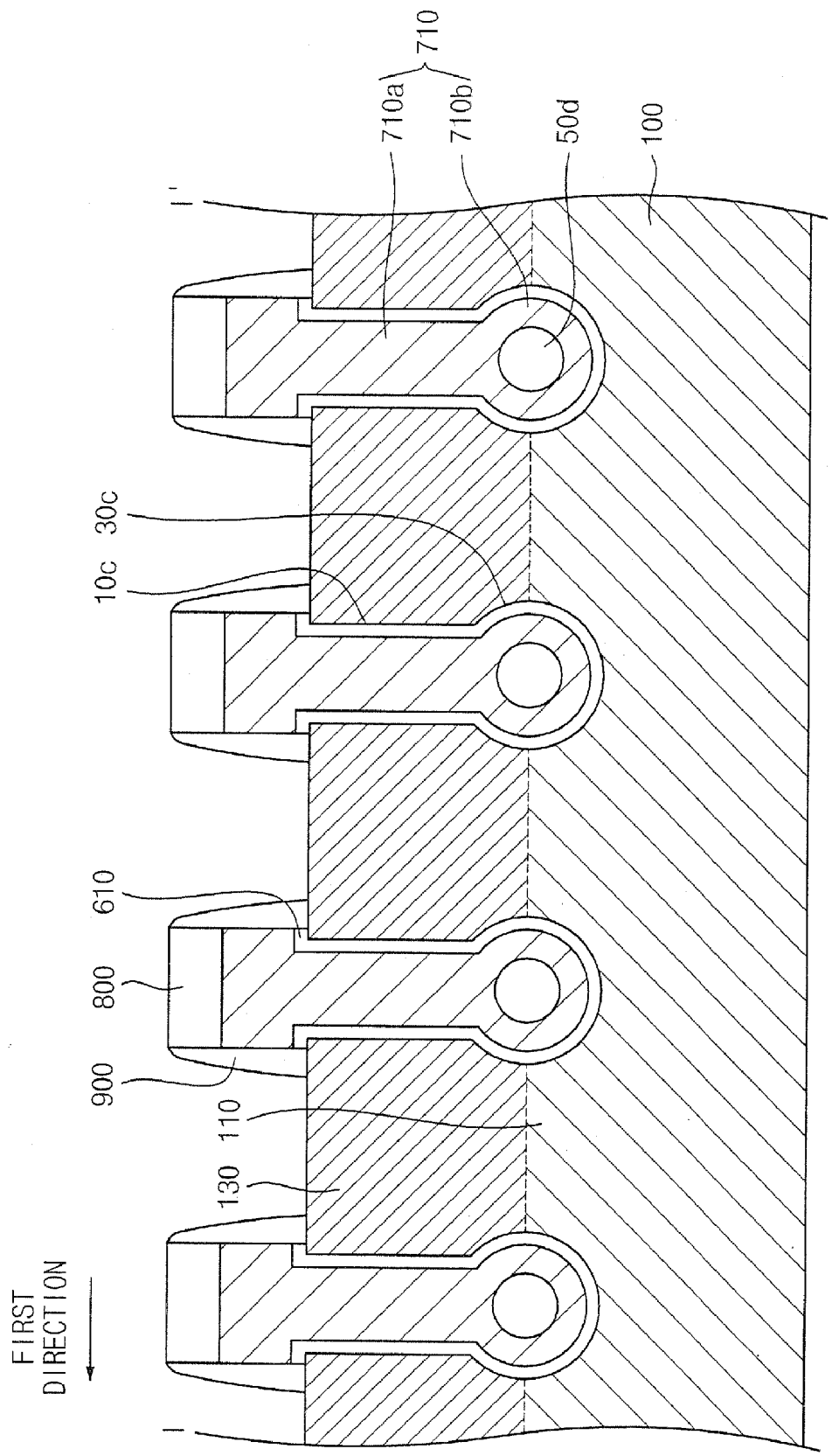
FIG. 15 is a cross-sectional view taken along the line I-I' of FIG. 14.
Figure 16:
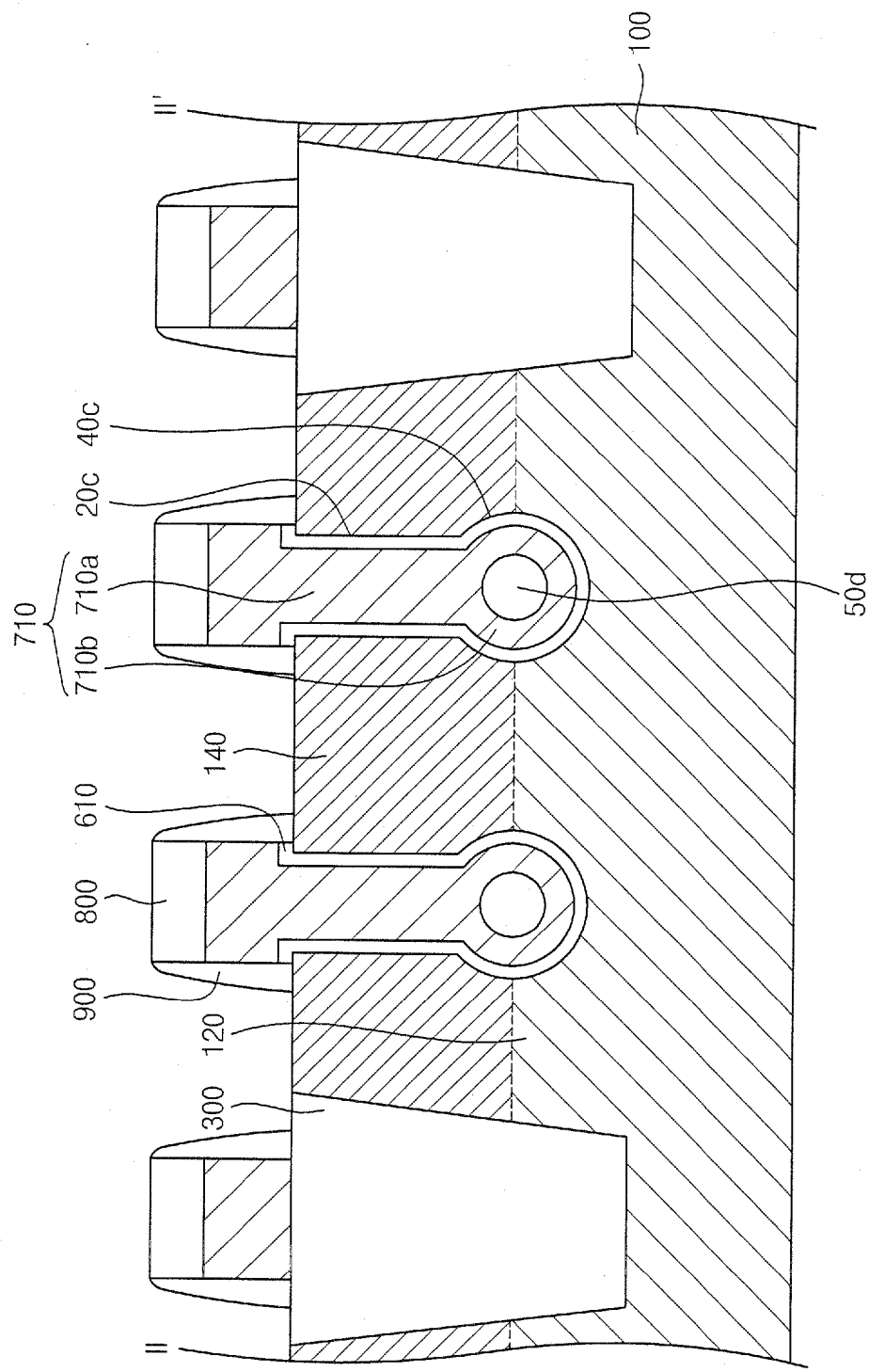
FIG. 16 is a cross-sectional view taken along the II-II' line in FIG. 14.

FIG. 14 is a plan view illustrating semiconductor devices in accordance with some embodiments of the invention. FIG. 15 is a cross-sectional view taken along I-I' line in FIG. 14. FIG. 16 is a cross-sectional view taken along II-II' line in FIG. 14.

Referring to FIGS. 14 to 16, a semiconductor device includes a dummy region 110, active regions 120, an isolation layer pattern 300, gate electrodes 10, gate oxide layer patterns 610, gate mask layer patterns 800 and spacers 900.

The dummy region 110 extends in a first direction. First grooves 10c and third grooves 30c are formed at an upper portion of the dummy region 110. The first grooves 10c and the third grooves 30c extend in a second direction substantially perpendicular to the first direction. The third grooves 30c are provided under the first grooves 10c such that the third grooves 30c are communicated with the first grooves 10c. The first grooves 10c and the third grooves 30c may be formed by an anisotropic etching process and an isotropic etching process, respectively. Dummy impurity regions 130 are formed at an upper face portion of the dummy region 110.

Second grooves 20c and fourth grooves 40c are formed at upper portions of the active regions 120. The second grooves 20c and the fourth grooves 40c extend in the second direction. The fourth grooves 40c are provided under the second grooves 20c such that the fourth grooves 20c are communicated with the second grooves 20c. The second grooves 20c and the fourth grooves 40c are formed by the anisotropic etching process and the isotropic etching process, respectively. Active impurity regions 140 are formed at upper face portions of the active regions 120.

Because the first grooves 10c and the second grooves 20c are formed by the anisotropic etching process, sidewalls of the first grooves 10c and the second grooves 20c are substantially vertical.

On the other hand, because the third grooves 30c and the fourth grooves 40c are formed by the isotropic etching process, sections of the third grooves 30c and the fourth grooves 40c taken along the first direction are substantially circular shapes.

Here, the sections may be varied depending on conditions of the isotropic etching process. For example, the sections may be substantially oval shaped or substantially semicircular shaped.

The isolation layer pattern 300 is provided between the dummy region 110 and the active regions 120 and between the active regions 120. Thus, the isolation layer pattern 300 insulates the dummy region 110 from the active regions 120 electrically. In addition, the isolation layer insulates the active regions 120 from one another electrically.

Here, the isolation layer pattern 300 may not cut the dummy region 110 in the second direction. Thus, the dummy region 110 may extend in the first direction.

The gate electrode 710 includes a first portion 710a and a second portion 710b. The first portion 710a extends in the second direction on the isolation layer pattern 300 such that the first portion 710a fills the first grooves 10c and the second grooves 20c. The second portions 710b are connected to the first portion 710a. The second portions 710b fill the third grooves 30c and the fourth grooves 40c. Each of the second portions 710b has a void 50d.

As described above, because the isolation layer pattern 300 does not cut the dummy region 110 in the second direction, the third and fourth grooves 30c and 40c are substantially symmetrical. Thus, the voids 50d may be generated at the centers of the second portions 710b.

As illustrated in FIG. 16, two gate electrodes 710 are formed on each of the active regions 120. On the other hand, as illustrated in FIG. 15, at least three gate electrodes 710 are formed on the dummy region 110. This is because the dummy region 110 extends in the first direction.

The gate oxide layer patterns 610 are formed between the gate electrodes 710 and the dummy region 110 and between the gate electrodes 710 and the active regions 120.

The gate mask layer patterns 800 are formed on each of the gate electrodes 710. The spacers 900 are formed on sidewalls of the gate oxide layer patterns 610, the gate electrodes 710 and the gate mask layer patterns 800.

Hereinafter, methods of manufacturing the semiconductor devices in FIGS. 14 to 16 will be described.

FIGS. 17, 18, 19, 20, 23, 26, 29, 32 and 35 are plan views illustrating the methods of manufacturing the semiconductor devices in FIGS. 14 to 16. FIGS. 21, 24, 27, 30, 33 and 36 are cross-sectional views taken along the I-I' line in FIGS. 20, 23, 26, 29, 32 and 35, respectively. FIGS. 22, 25, 28, 31, 34 and 37 are cross-sectional views taken along the II-II' line in FIGS. 20, 23, 26, 29, 32 and 35, respectively.

Referring to FIG. 17, a hard mask layer pattern 200 is formed on a semiconductor substrate 100. The hard mask layer pattern 200 partially exposes the semiconductor substrate 100. The hard mask layer pattern 200 includes a first portion 200a and second portions 200b. A dummy region 110 (see FIG. 15) is to be formed under the first portion 200a. Active regions 120 (see FIG. 15) are to be formed under the second portions 200b. The dummy region 110 extends in a first direction in which the I-I' line extends.

Referring to FIG. 18, the semiconductor substrate 100 is etched using the hard mask layer pattern 200 as an etch mask. The hard mask layer pattern 200 is then removed. Thus, the dummy region 110 and the active regions 120 are formed at an upper portion of the semiconductor substrate 100. Because the dummy region 110 is formed under the first portion 200a extending in the first direction, the dummy region 110 also extends in the first direction.

Referring to FIG. 19, a silicon oxide layer (not shown) is formed on the semiconductor substrate 100 to cover the dummy region 110 and the active regions 120. Thereafter, a planarization process is performed until the dummy region 110 and the active regions 120 are exposed so that an isolation layer pattern 300 may be formed.

The dummy region 110 may prevent the active regions 120 from leaning while the planarization process is performed. Because the dummy region 110 extends in the first direction, the dummy region 110 may not lean while the planarization process is performed.

Here, the isolation layer pattern 300 corresponds to a field region. Because the dummy region 110 extends in the first direction, the dummy region 110 is not cut by the isolation layer pattern 300.

Figure 20:
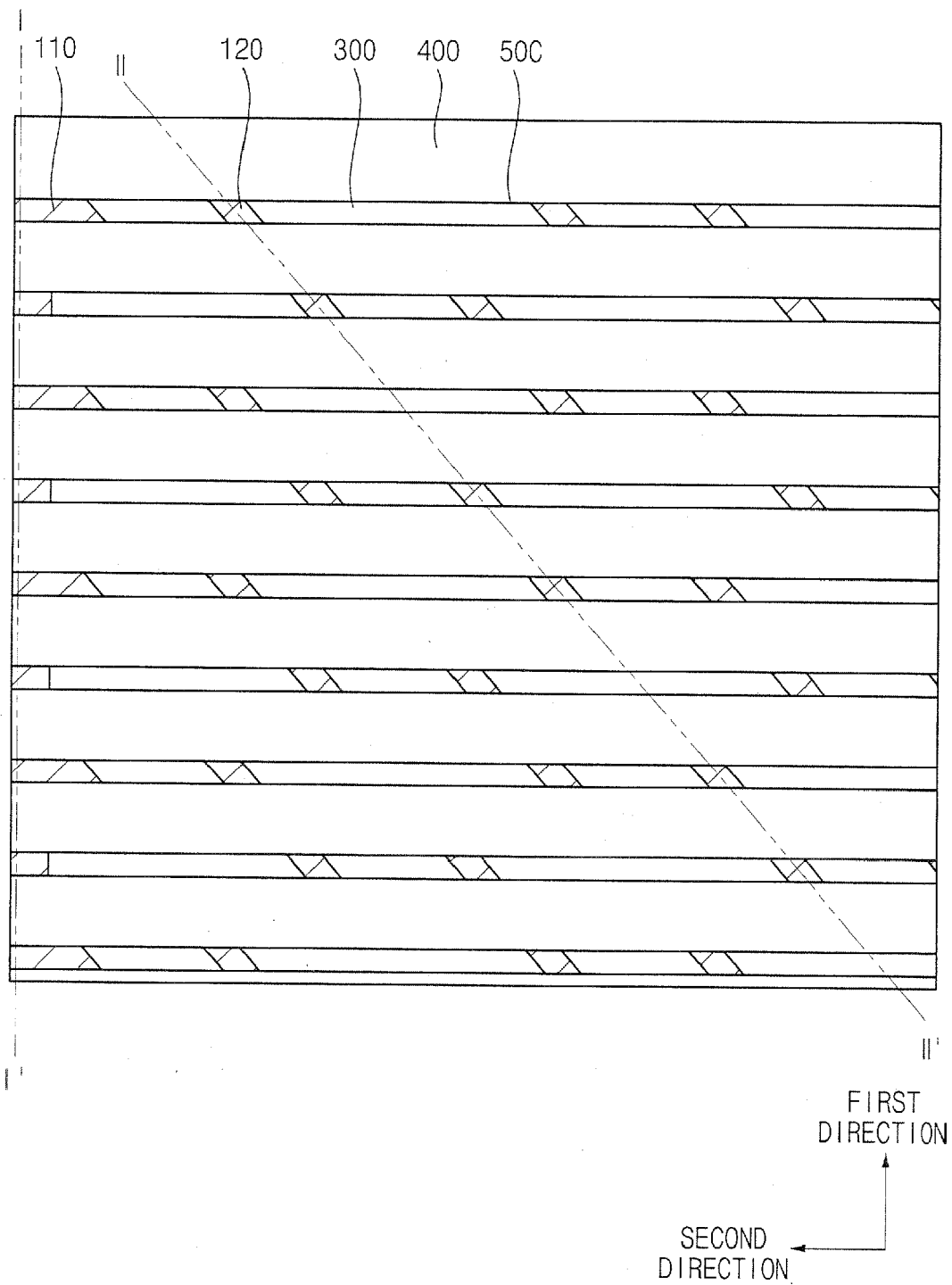
Figure 21:
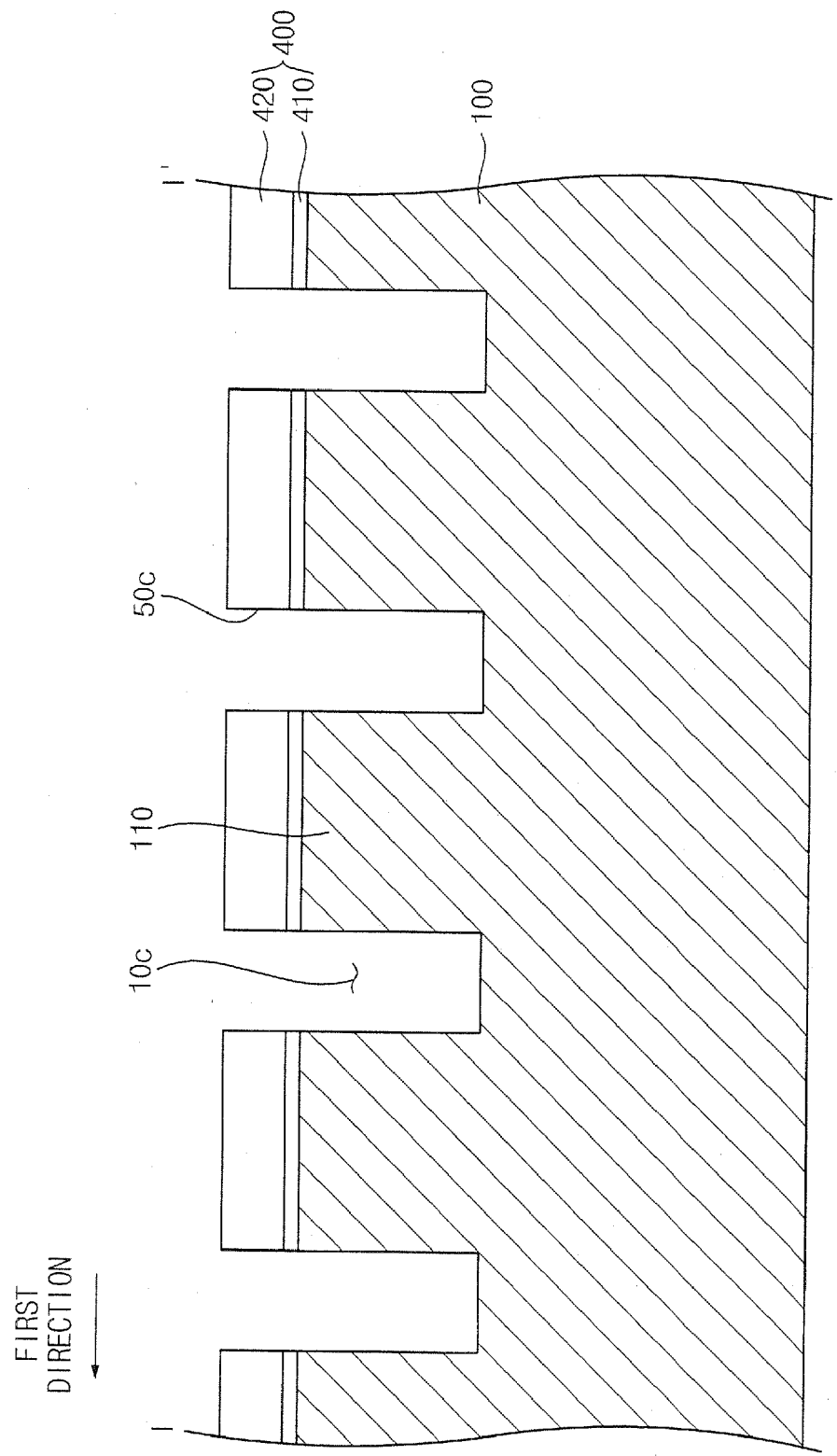
FIGS. 21, 24, 27, 30, 33 and 36 are cross-sectional views taken along the I-I' lines in FIGS. 20, 23, 26, 29, 32 and 35, respectively.
Figure 22:
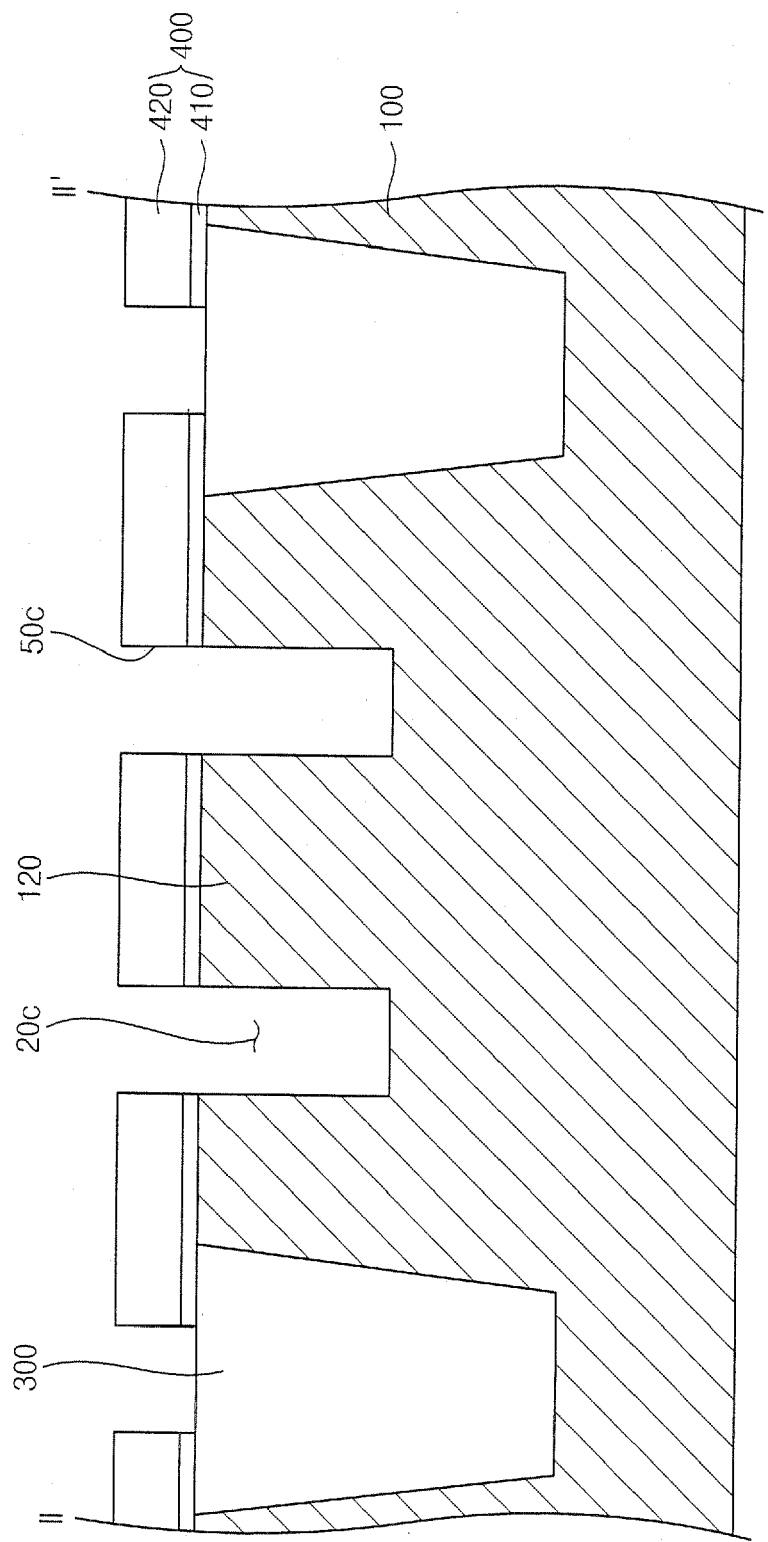
FIGS. 22, 25, 28, 31, 34 and 37 are cross-sectional views taken along the II-II' lines in FIGS. 20, 23, 26, 29, 32 and 35, respectively.

Referring to FIGS. 20 to 22, a mask structure 400 is formed on the dummy region 110, the active regions 120 and the isolation layer pattern 300. The mask structure 400 has first openings 50c partially exposing the dummy region 110, the active regions 120 and the isolation layer pattern 300. The first openings 50c and the mask structure 400 extend in a second direction substantially perpendicular to the first direction. The mask structure 400 includes silicon nitride layer patterns 420 and buffer layer patterns 410. The silicon nitride layer patterns 420 are formed on each of the buffer layer patterns 410. The buffer layer patterns 410 may include silicon oxide.

Thereafter, the dummy region 110 and the active regions 120 are etched using the mask structure 400 as an etch mask. Thus, first grooves 10c and second grooves 20c are formed at an upper portion of the dummy regions 110 and upper portions of the active regions 120, respectively. Because the first openings 50c extend in the second direction, the first grooves 10c and the second grooves 20c also extend in the second direction.

Figure 23:
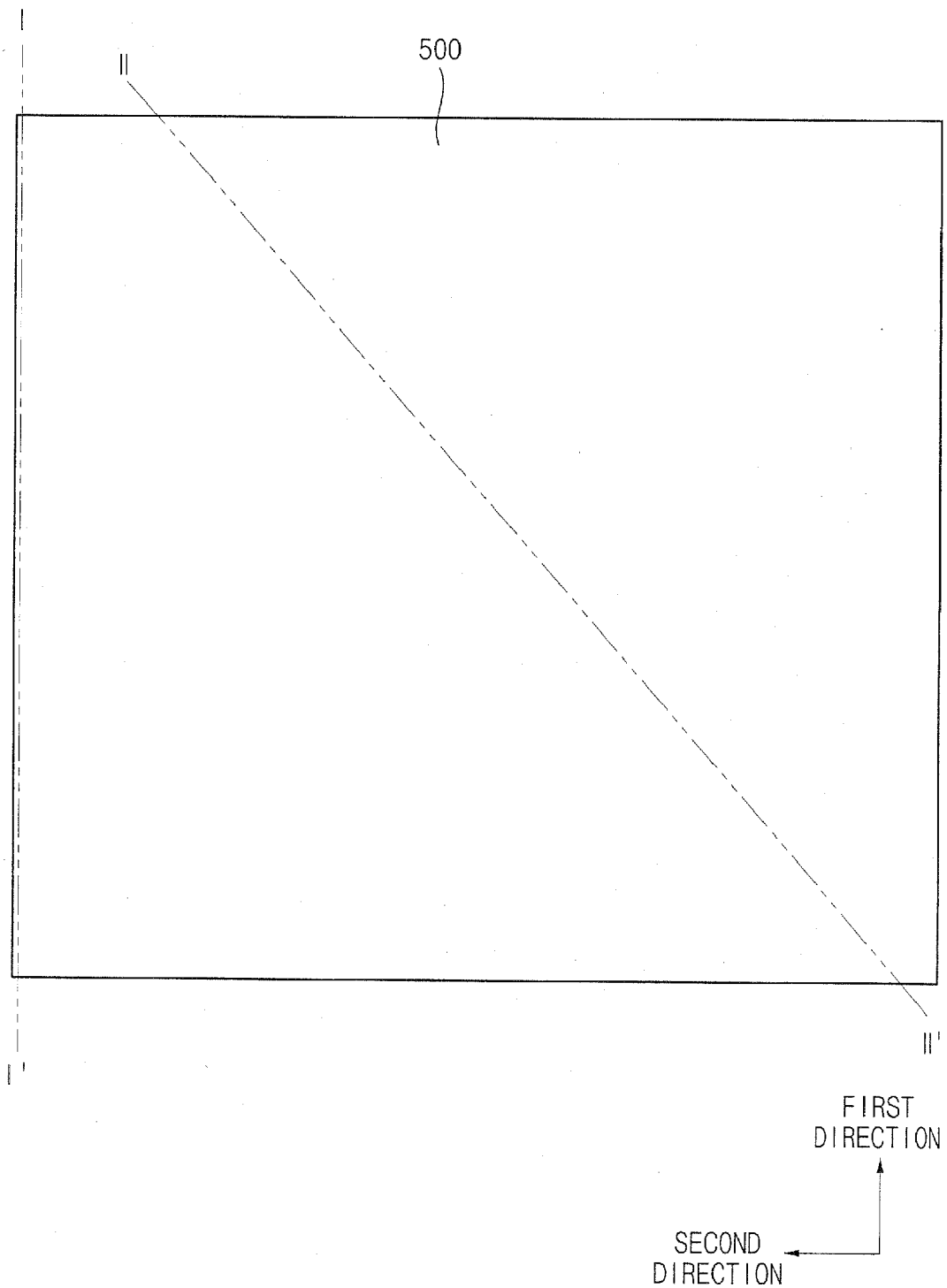
Figure 24:
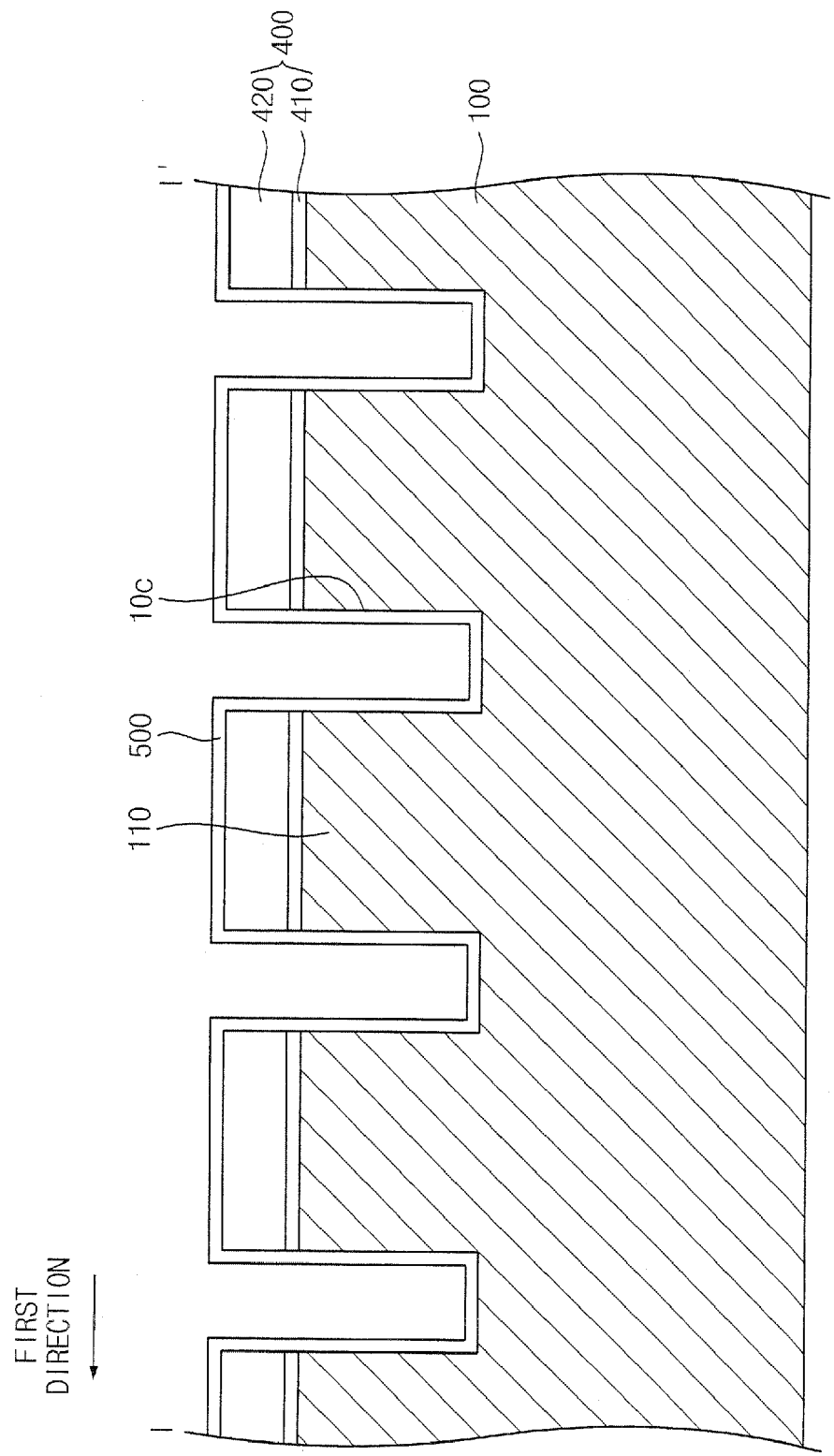
Figure 25:
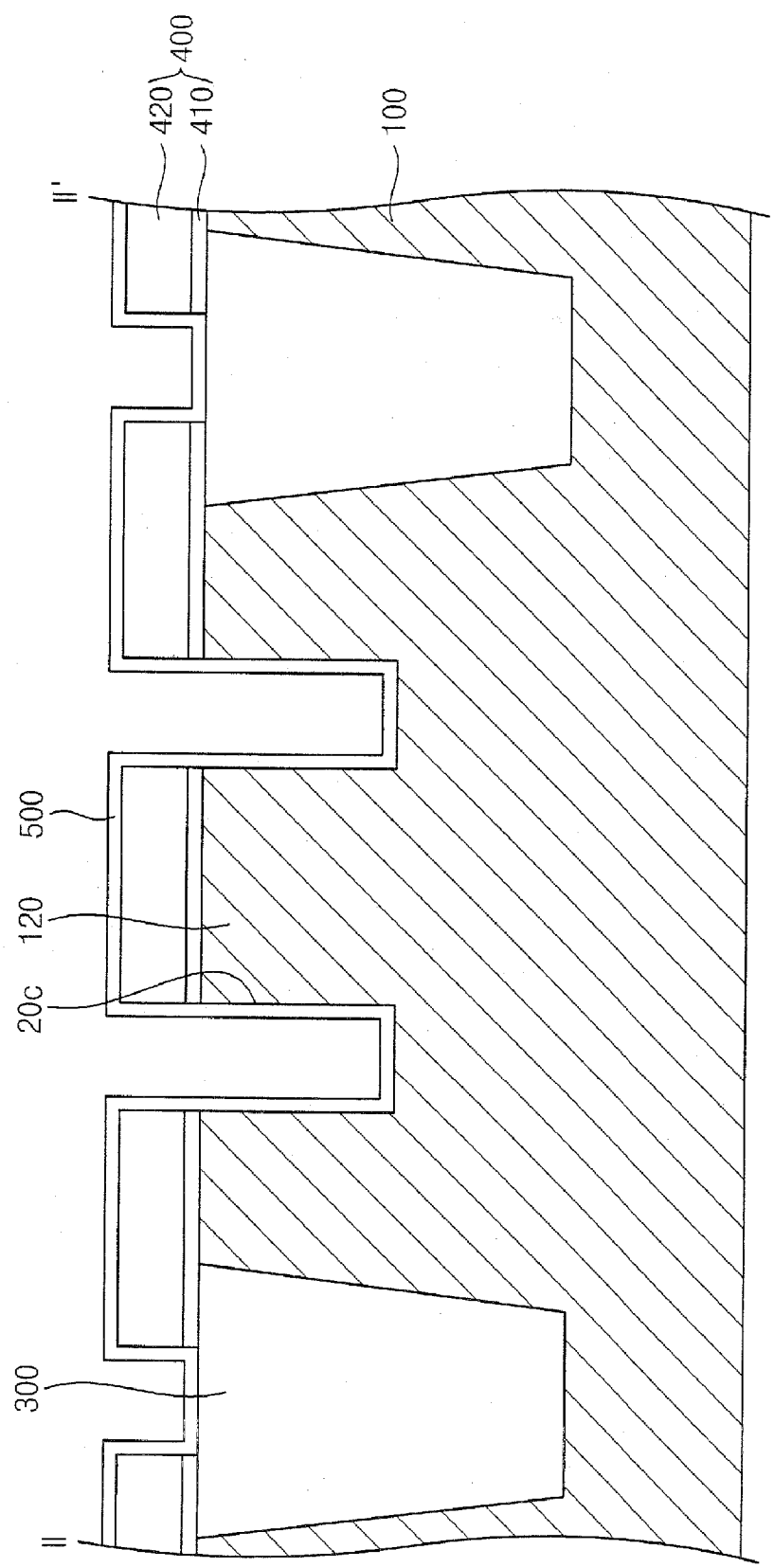

Referring to FIGS. 23 to 25, a silicon oxide layer 500 having a substantially uniform thickness is formed on the mask structure 400, the dummy region 110, the active regions 120 and the isolation layer pattern 300. Thus, inner faces of the first grooves 10c and the second grooves 20c are covered with the silicon oxide layer 500. Here, the silicon oxide layer 500 may conform to the first grooves 10c and the second grooves 20c. For example, the silicon oxide layer 500 may be formed by a chemical vapor deposition (CVD) process.

Figure 26:
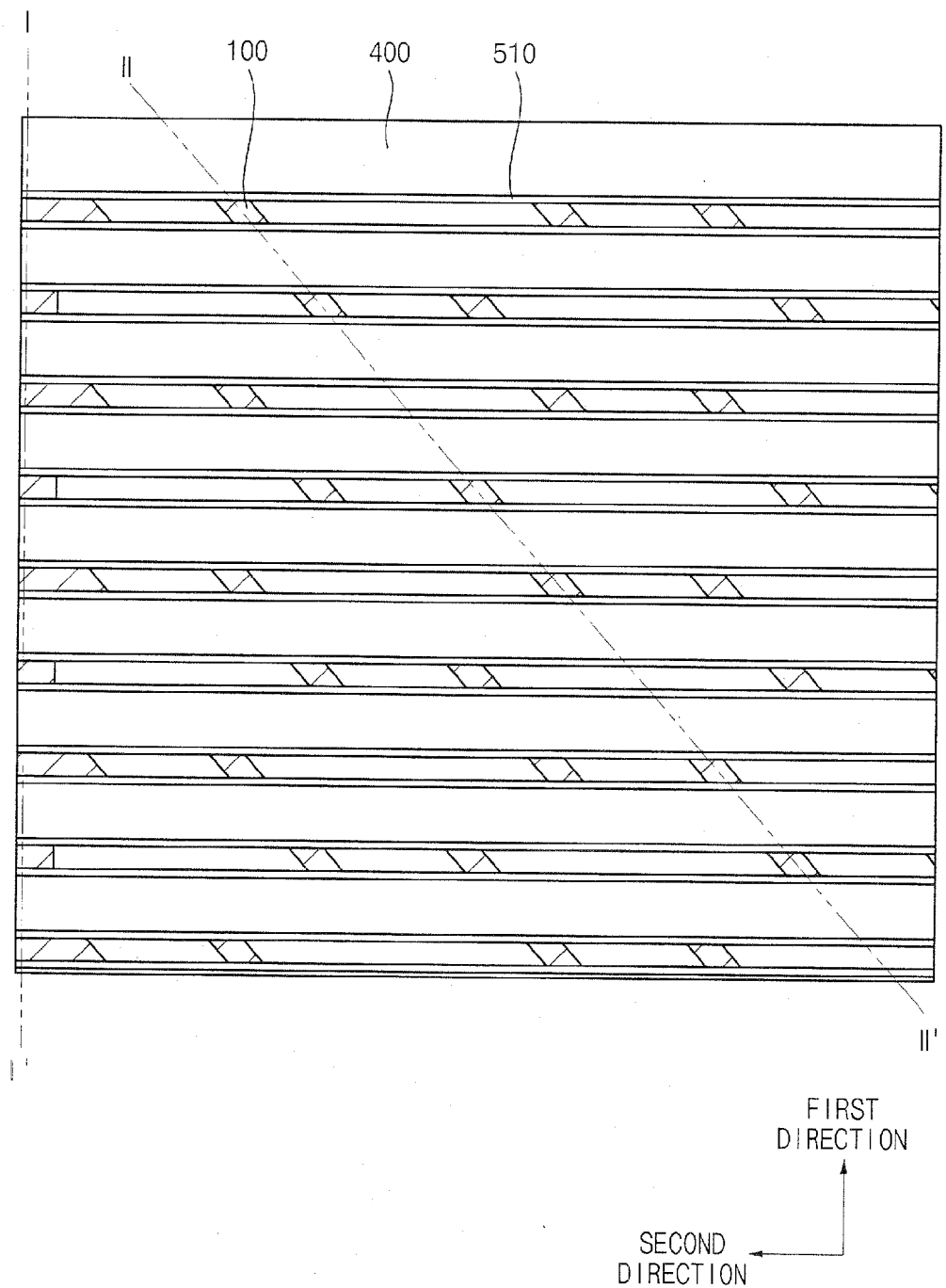
Figure 27:
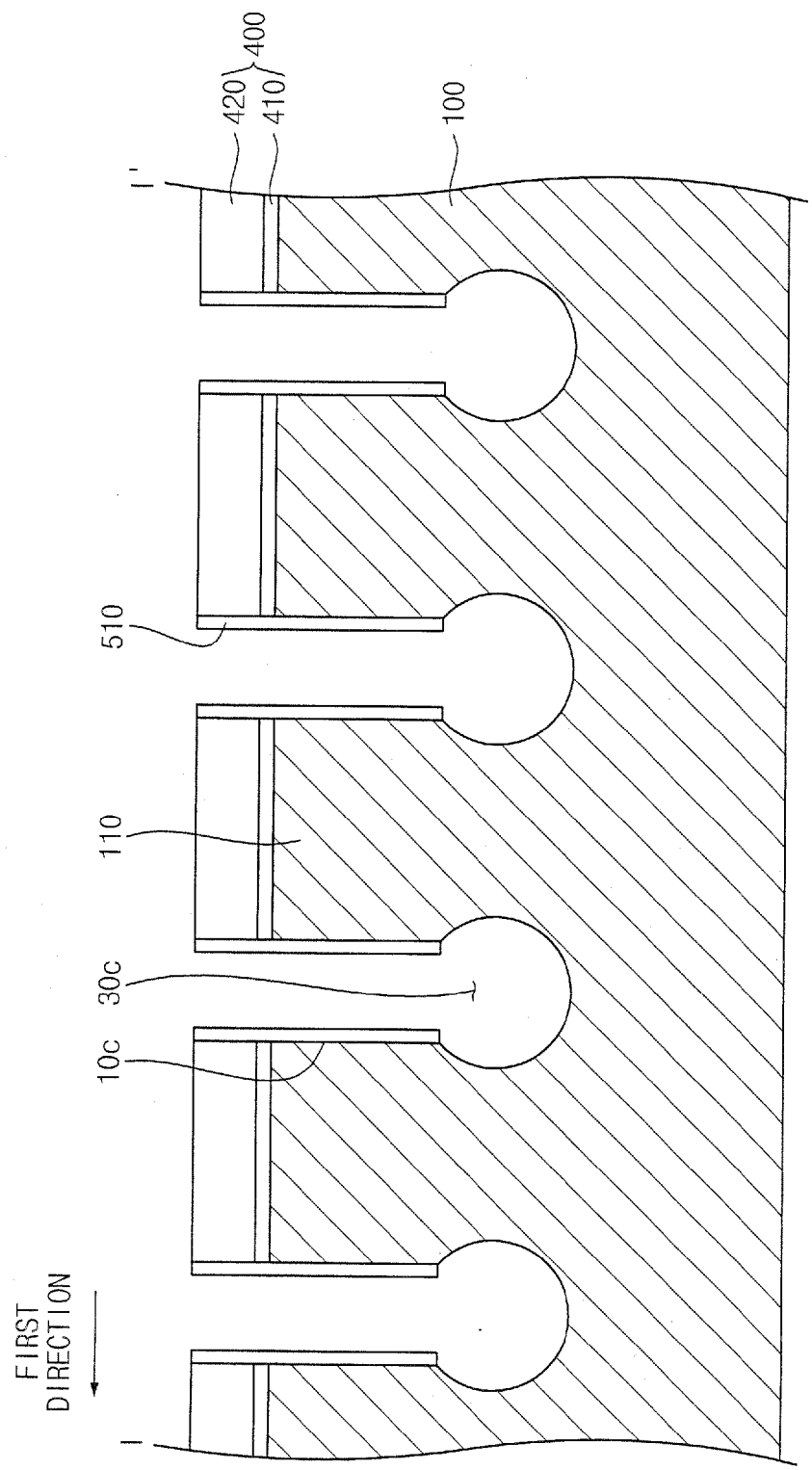
Figure 28:
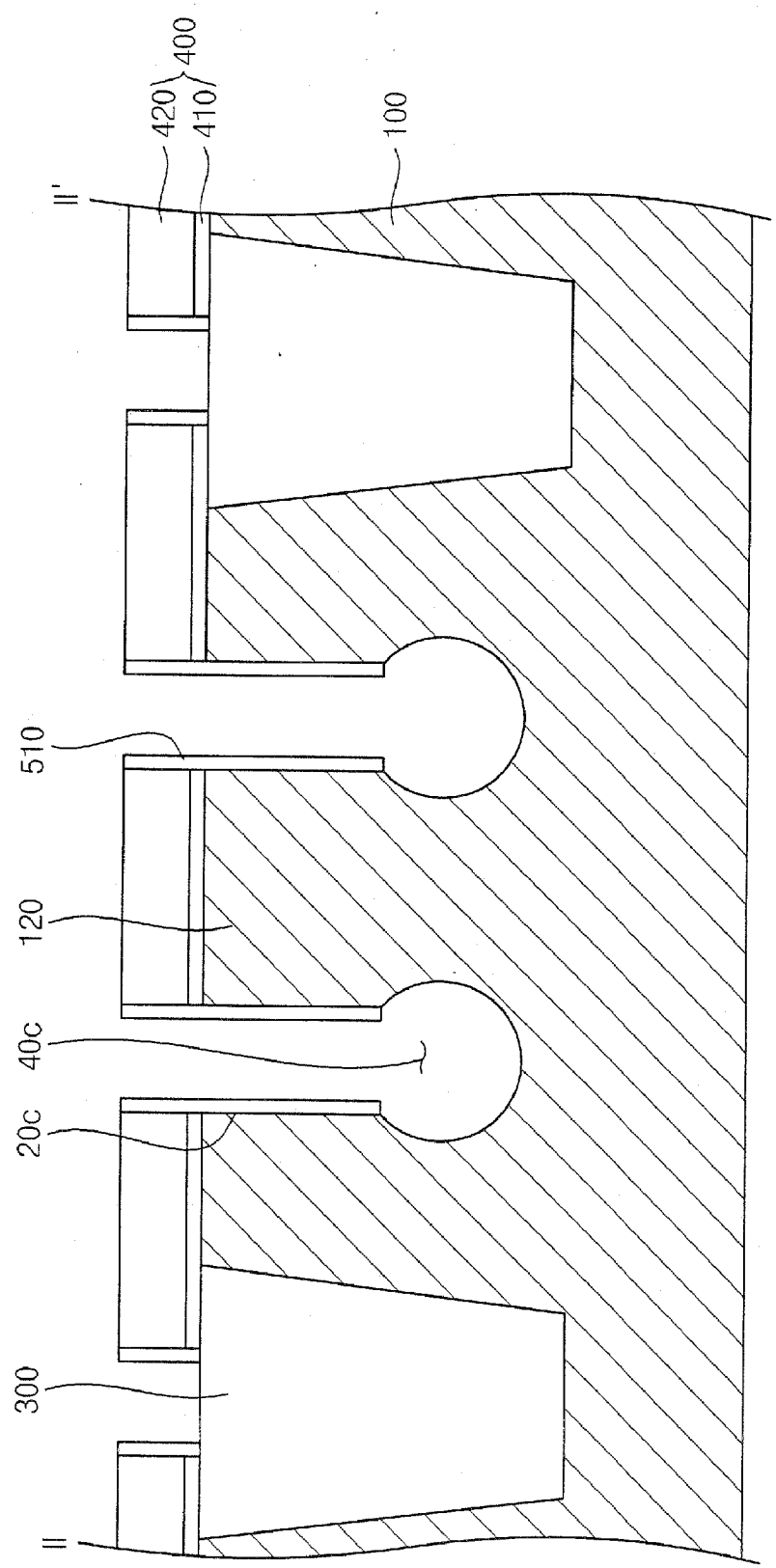

Referring to FIGS. 26 to 28, portions of the silicon oxide layer 500 located on bottom faces of the first grooves 10c, bottom faces of the second grooves 20c and the mask structure 400 are selectively removed. Thus, silicon oxide layer patterns 510 are formed on sidewalls of the first grooves 10c and the second grooves 20c.

Thereafter, portions of the dummy region 110 and portions of the active regions 120 that are exposed through the first grooves 10c and the second grooves 20c, respectively, are isotropically etched using the mask structure 400 and the silicon oxide layer patterns 510 together as an etch mask. Thus, third grooves 30c communicated with the first grooves 10c may be formed under the first grooves 10c. Here, the third grooves 30c may extend in the second direction. In addition, fourth grooves 40c communicated with the second grooves 20c are formed under the second grooves 20c. The fourth grooves 40c extend in the second direction.

Because the third grooves 30c and the fourth grooves 40c are formed by an isotropic etching process, sections of the third grooves 30c and the fourth grooves 40c taken along the first direction are substantially circular shapes. Here, the sections may be varied depending on conditions of the isotropic etching process. As one example, the sections may be substantially oval shapes. As another example, the sections may be substantially semicircular shapes.

As described above, the sections of the fourth grooves 40c taken along the first direction are substantially circular shapes. Thus, channel regions may be enlarged. As illustrated in FIG. 27, the dummy region 110 may not be cut in the second direction by the isolation layer pattern 300. Thus, the isolation layer pattern 300 may not exist between the third grooves 30c formed at the dummy region 110. As a result, the sections of the third grooves 30c taken along the first direction are substantially symmetrical.

Figure 29:
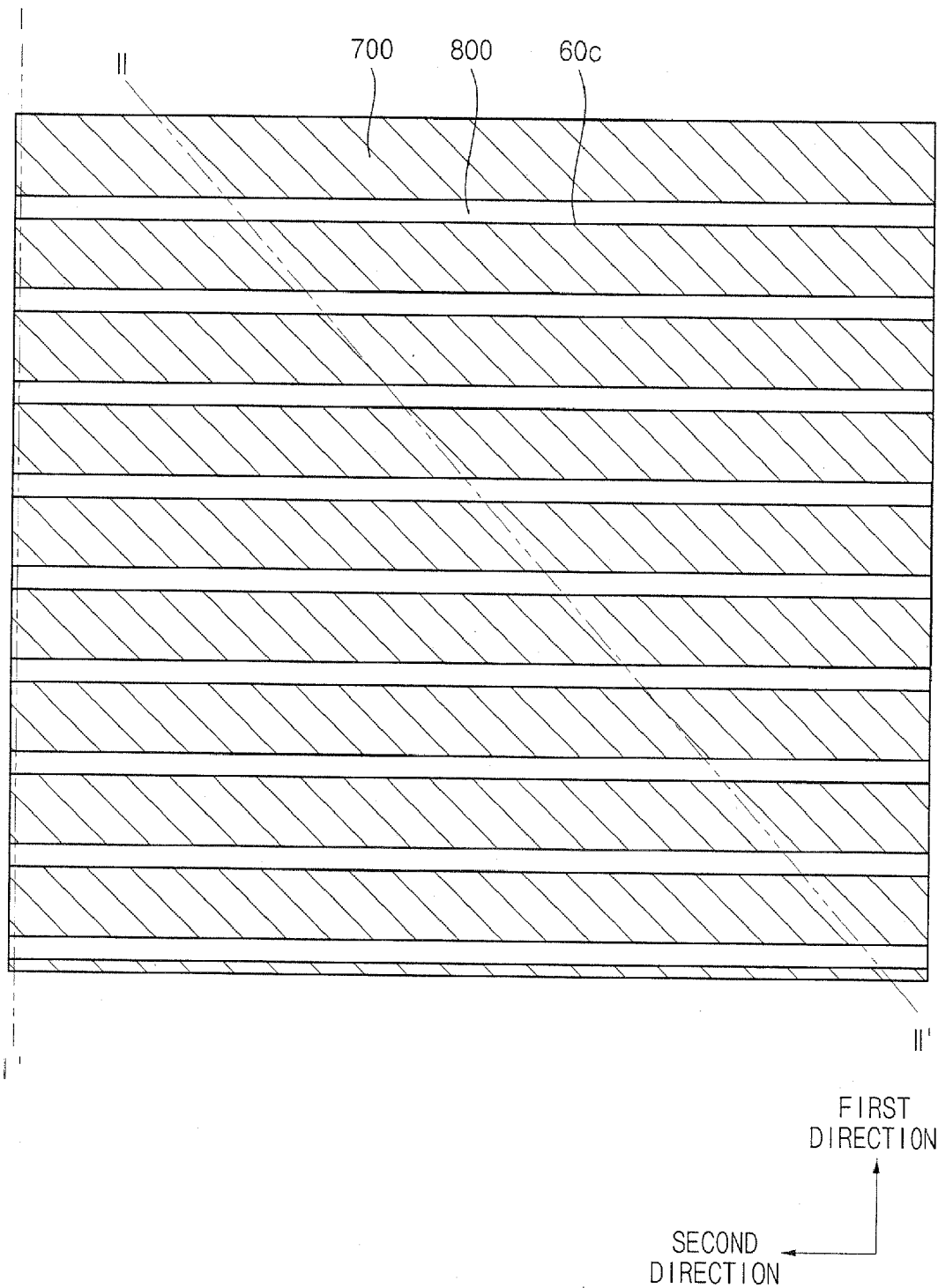
Figure 30:
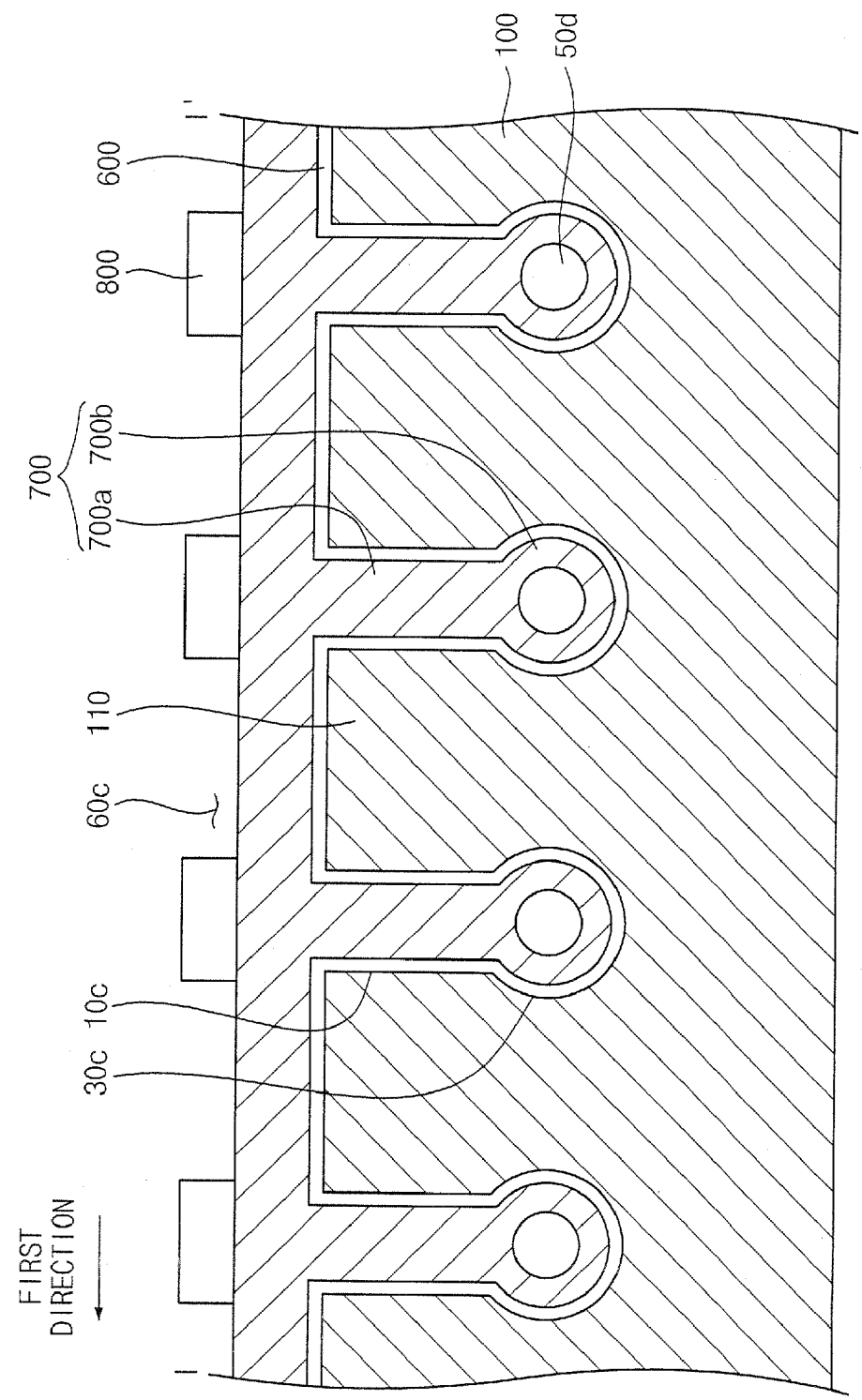
Figure 31:
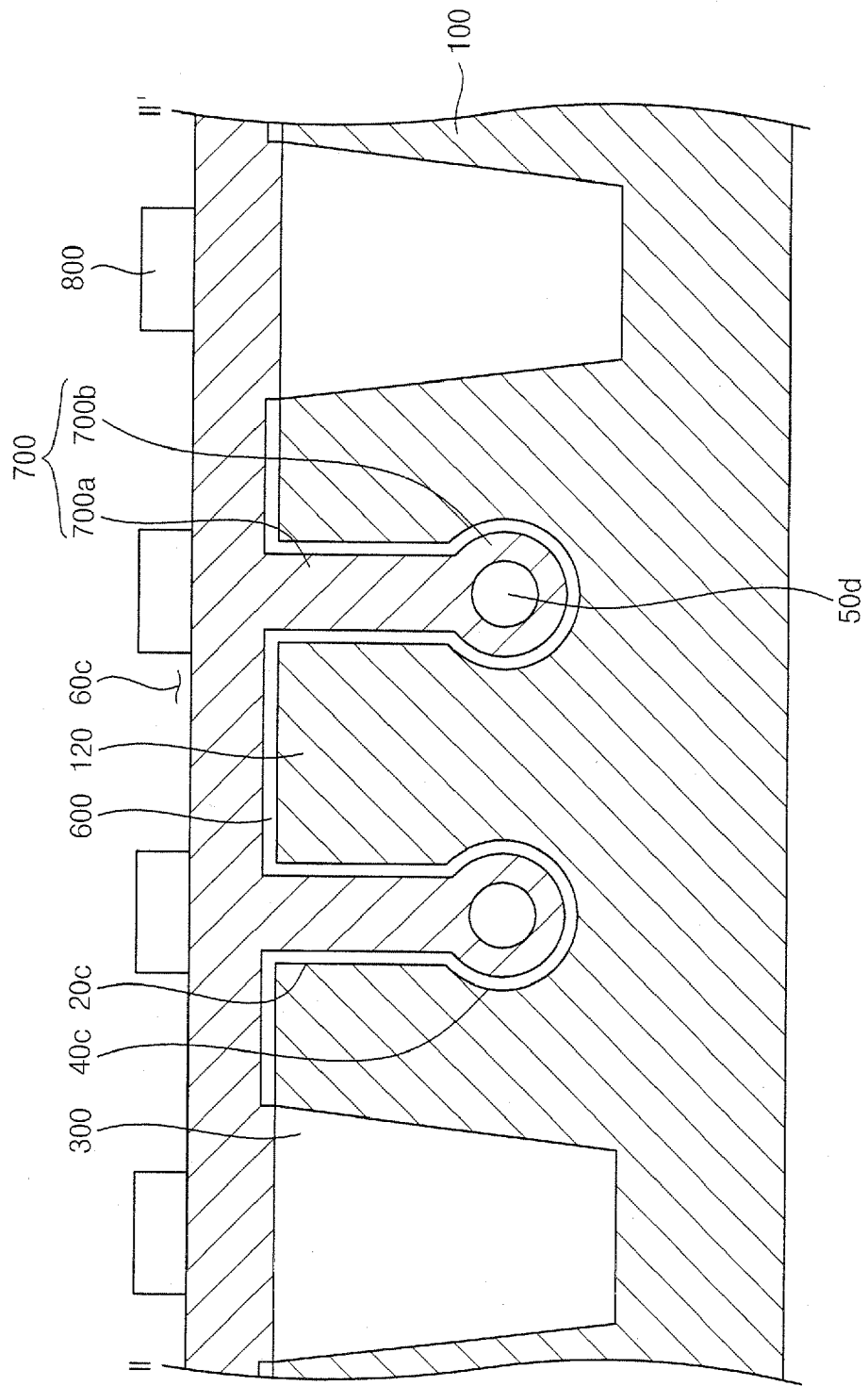

Referring to FIGS. 29 to 31, the mask structure 400 and the silicon oxide layer patterns 510 are removed. Thereafter, gate oxide layers 600 including silicon oxide are formed on faces of the active regions 120 and the dummy region 110, the faces being exposed by the isolation layer pattern 300. The gate oxide layers 600 have substantially uniform thicknesses. Thus, inner faces of the first, second, third and fourth grooves 10c, 20c, 30c and 40c are covered with the gate oxide layers 600. The gate oxide layers 600 are formed by a thermal oxidation process.

The isolation layer pattern 300 defines the first, second, third and fourth grooves 10c, 20c, 30c and 40c in the second direction. Thus, if the gate oxide layers 600 are formed by the thermal oxidation process, the gate oxide layers 600 may not be formed on portions of the isolation layer pattern 300, the portions defining the first, second, third and fourth grooves 10c, 20c, 30c and 40c in the second direction.

Thereafter, a gate electrode layer 700 is formed on the gate oxide layers 600 and the isolation layer pattern 300. The gate electrode layer 700 includes a first portion 700a and second portions 700b. The first portion 700a fills up the first and second grooves 10c and 20c partially filled with the gate oxide layers 600. The second portions 700b fill up the third and fourth grooves 30c and 40c partially filled with the gate oxide layers 600. Each of the second portions 700b has a void 50d. The gate electrode layer 700 may include conductive material such as metal or polysilicon doped with impurities.

As described above, the sections of the third and fourth grooves 20 and 40 taken along the first direction are substantially circular shapes. Thus, voids 50d are generated in the second portions 700b when the gate electrode layer 700 fills the third and fourth grooves 30c and 40c.

As already illustrated in FIG. 27, the sections of the third and fourth grooves 30c and 40c taken along the first direction are substantially symmetrical. Thus, the voids 50d may be formed at the centers of the second portions 700b. That is, the voids 50d may not migrate from the centers of the second portions 700b.

Thereafter, gate mask layer patterns 800 are formed on the gate electrode layer 700. Second openings 60c are defined between the gate mask layer patterns 800. The gate electrode layer 700 is partially exposed through the second openings 60c. The second openings 60c and the gate mask layer patterns 800 extend in the second direction. Here, the gate mask layer patterns 800 correspond to word lines. Thus, the word lines extend in the second direction.

Figure 32:
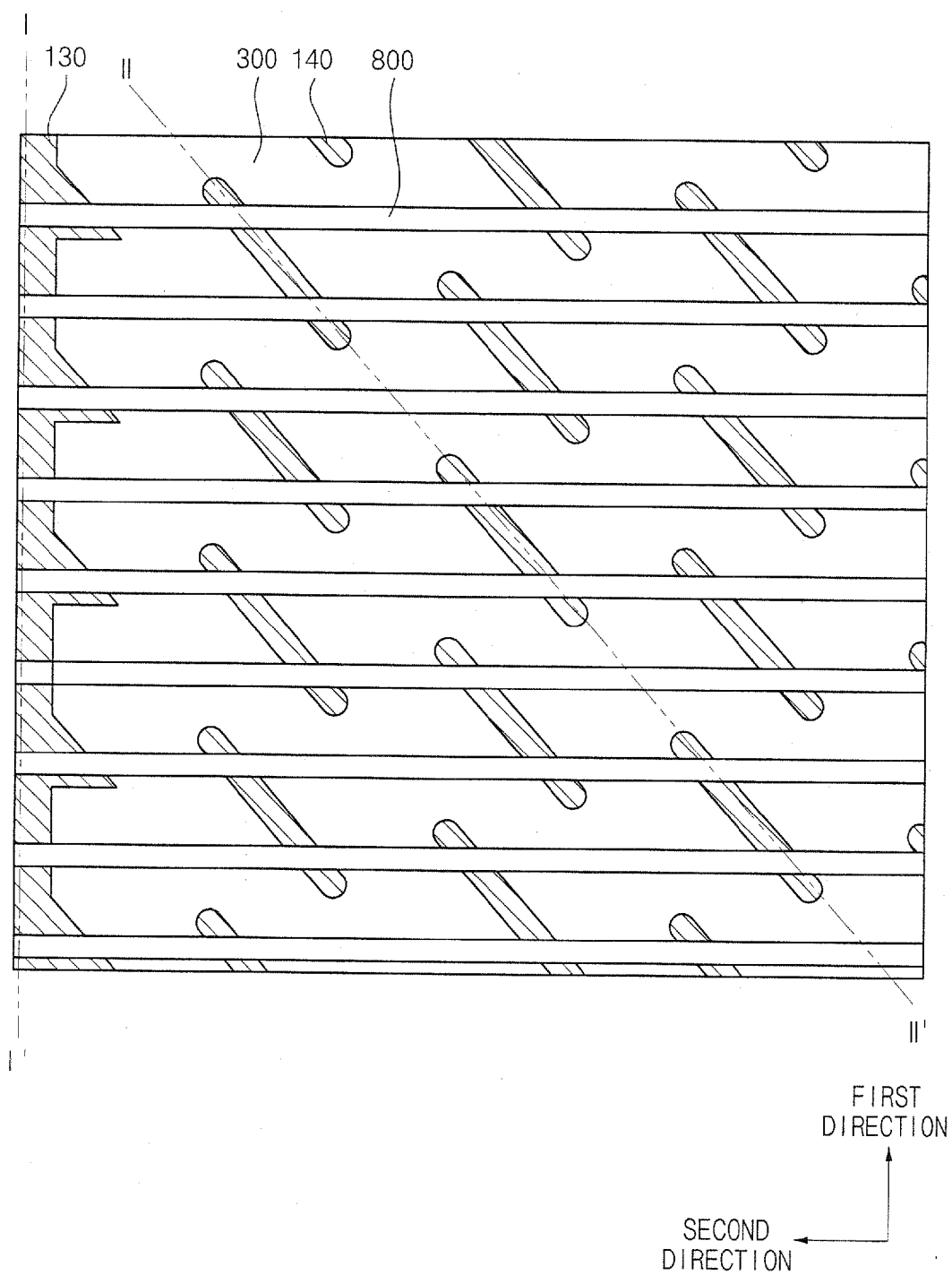
Figure 33:
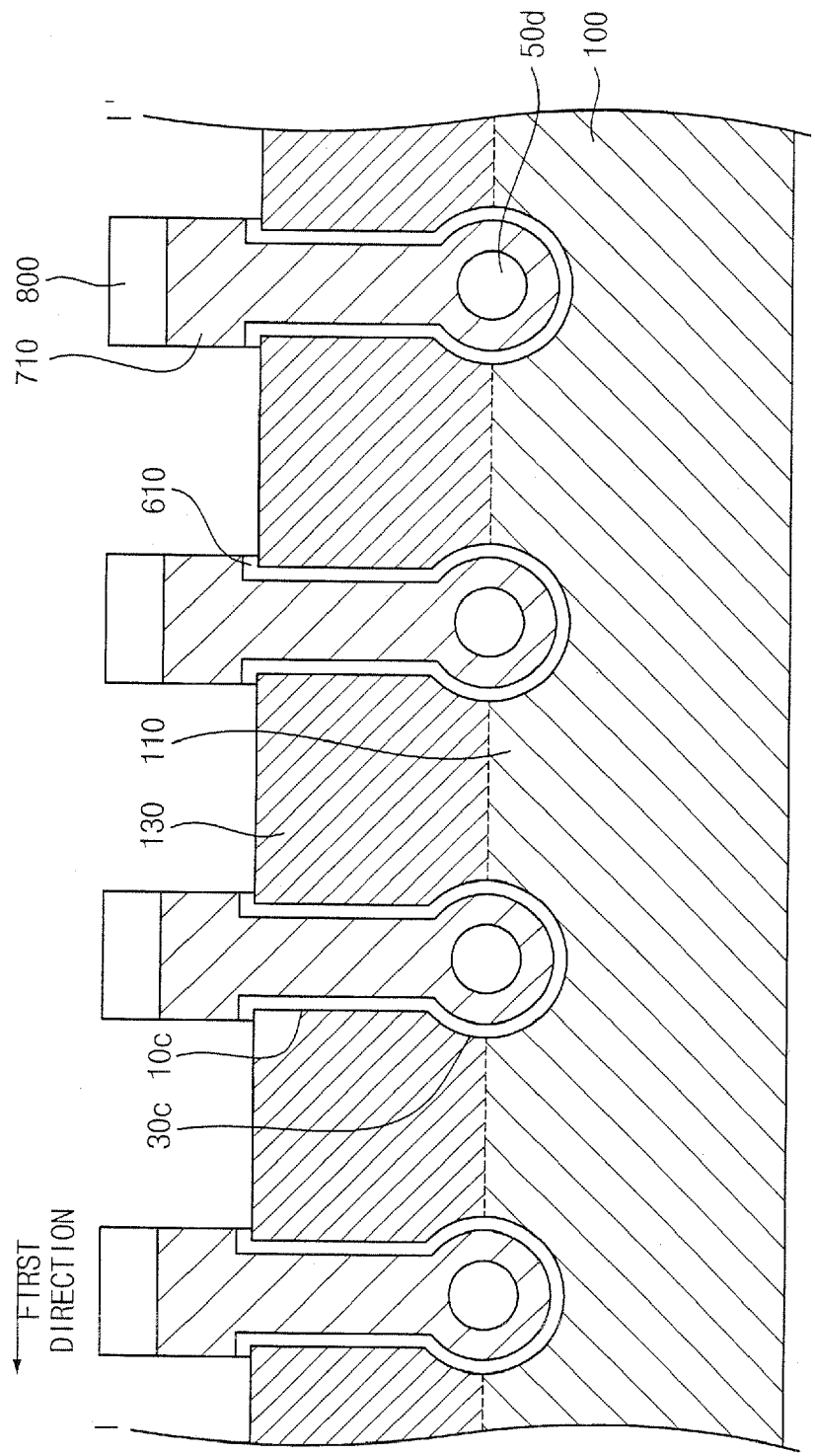
Figure 34:
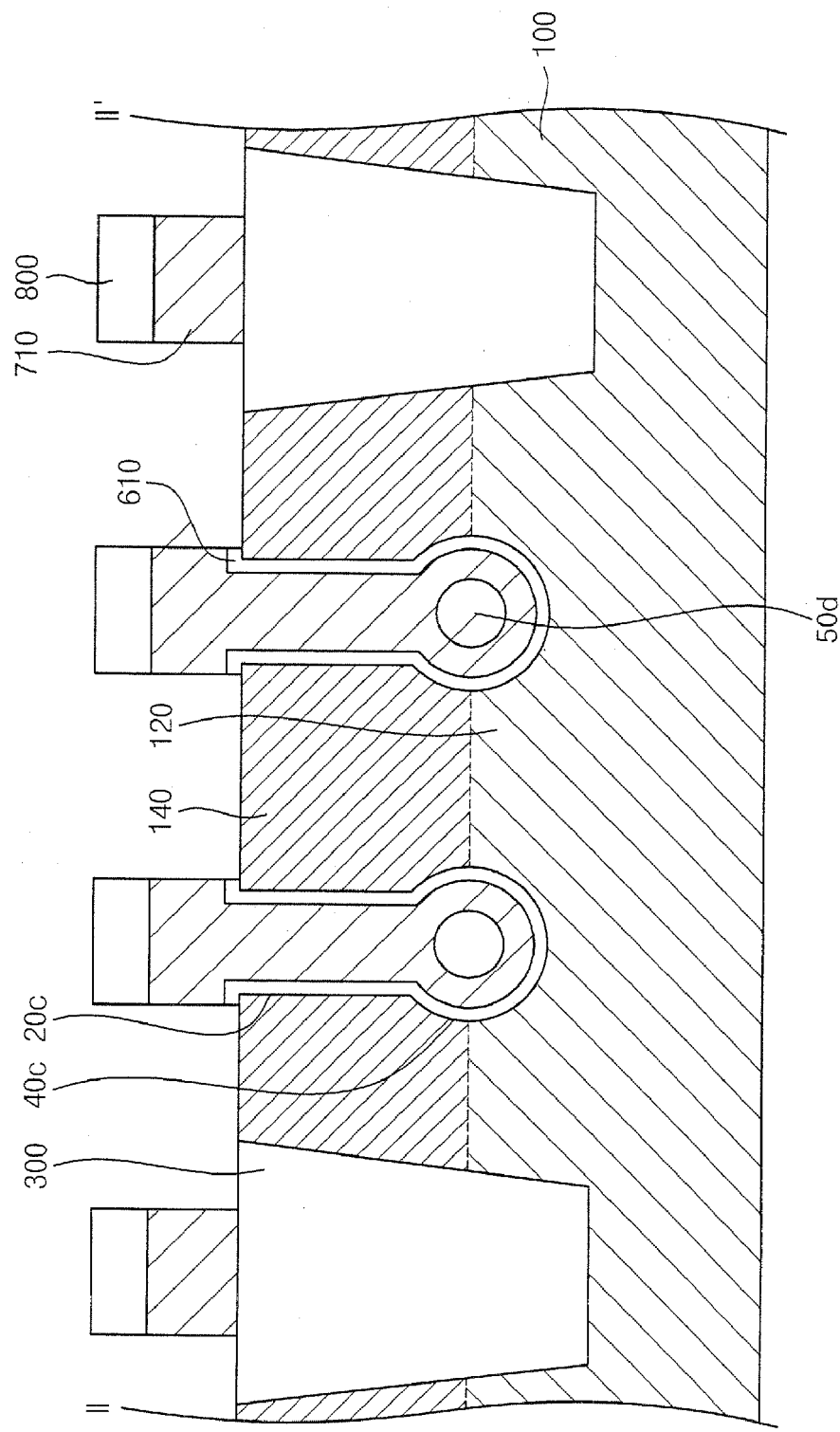

Referring to FIGS. 32 to 34, the gate electrode layer 700 and the gate oxide layers 600 are subsequently etched using the gate mask layer patterns 800 as an etch mask. Thus, gate electrodes 710 and gate oxide layer patterns 610 are formed.

As illustrated in FIG. 34, two gate electrodes 710 are formed on each of the active regions 120. However, as illustrated in FIG. 33, at least three gate electrodes 710 are formed on the dummy region 110. This is because the dummy region 110 extends in the first direction.

An ion implantation process is performed using the gate mask layer patterns 800 and the isolation layer pattern 300 together as an ion implantation mask so that dummy impurity regions 130 and active impurity regions 140 are formed at an upper face portion of the dummy region 110 and upper face portions of the active regions 120, respectively.

Figure 35:
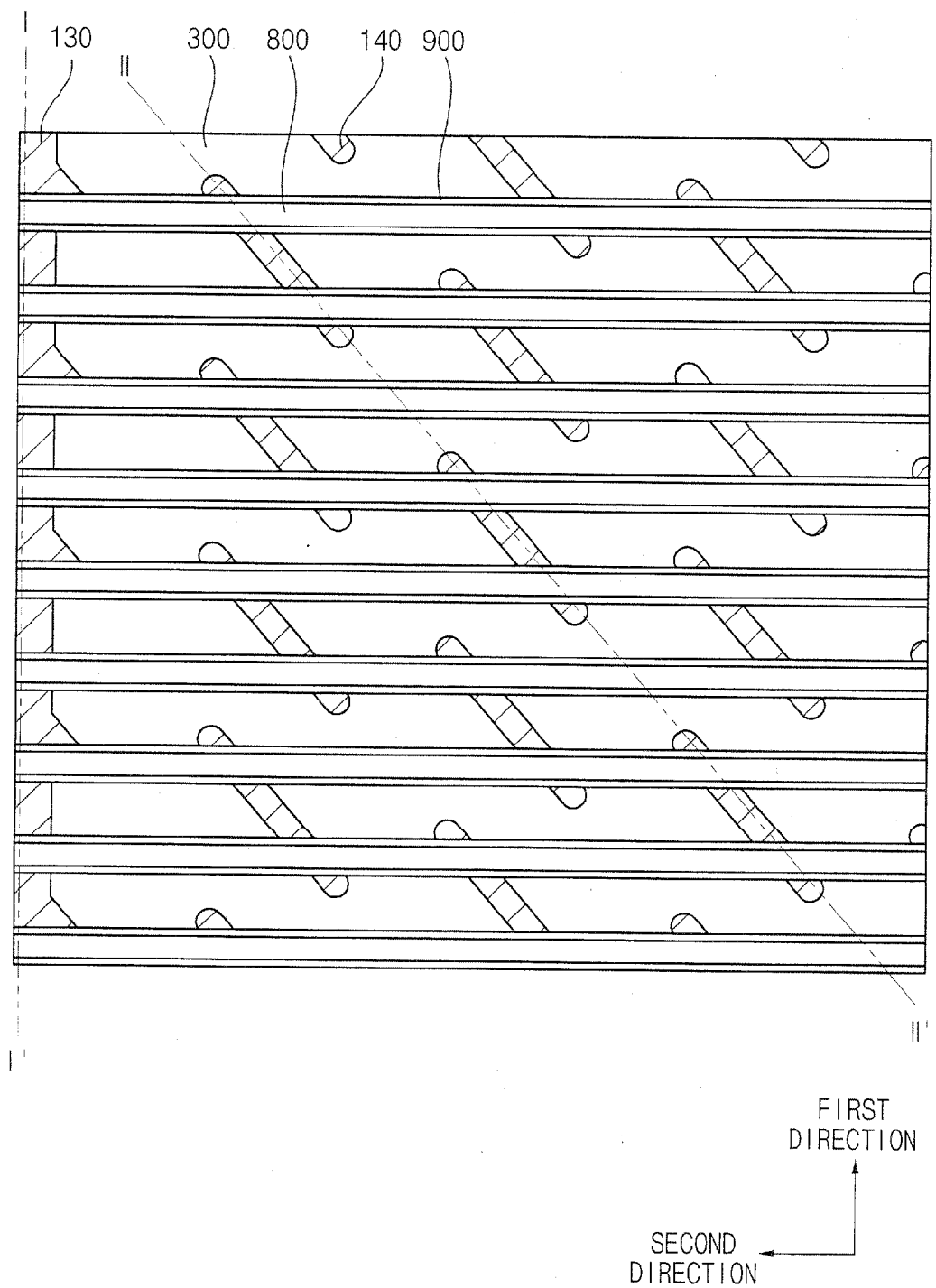
Figure 36:
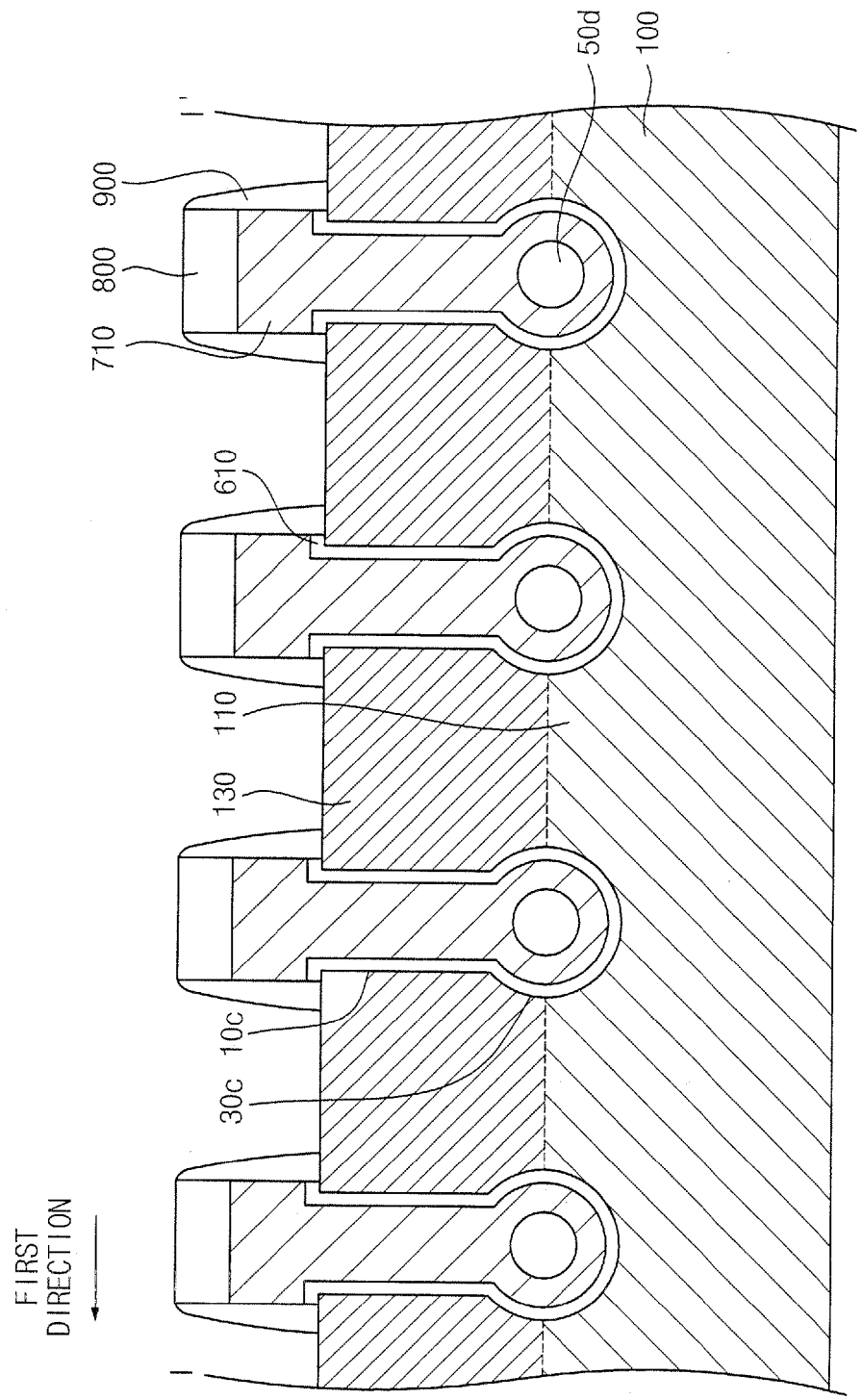
Figure 37:
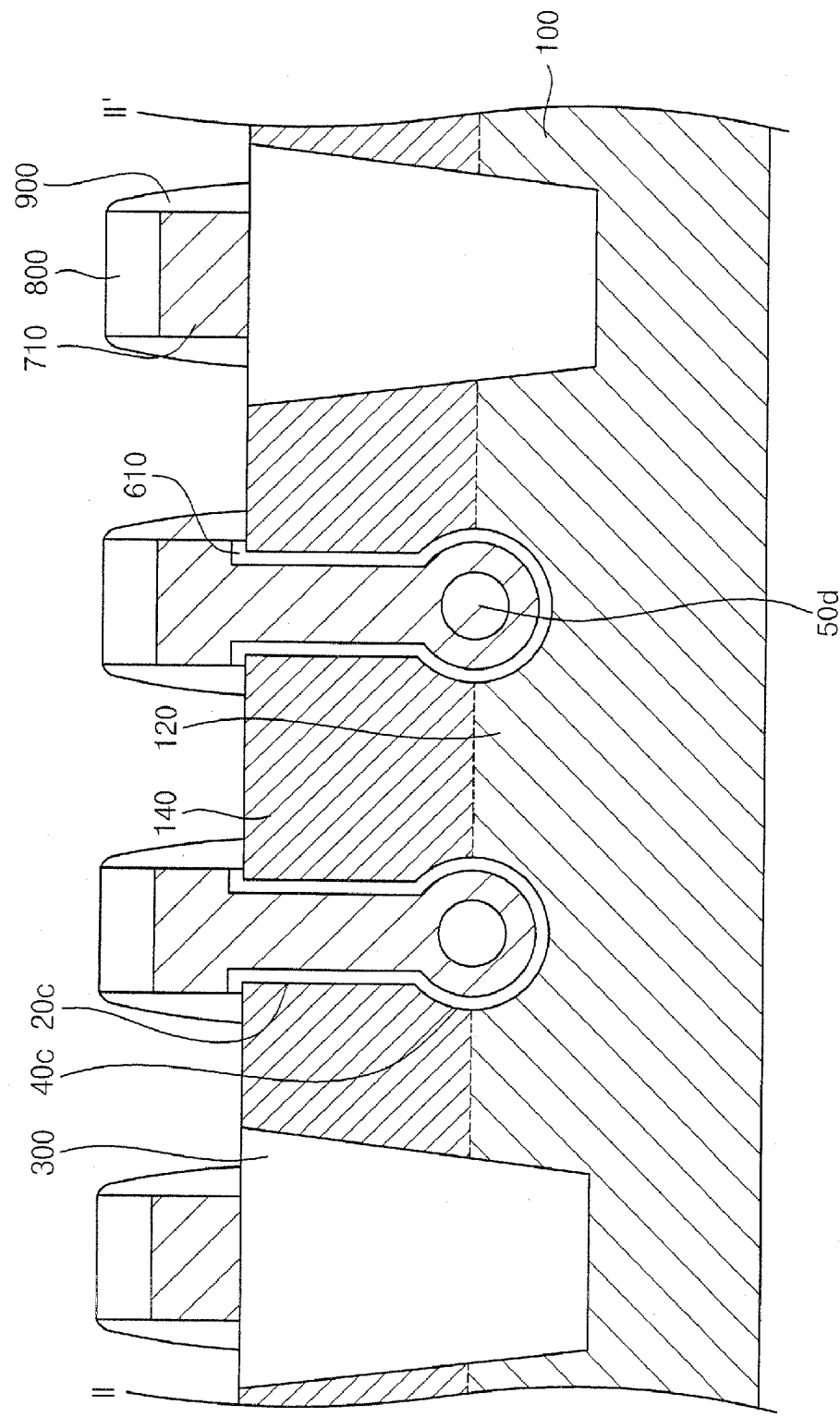

Referring to FIGS. 35 to 37, an insulating layer (not shown) is formed to cover the dummy impurity regions 130, the active impurity regions 140, the isolation layer pattern 300, the gate oxide layer patterns 610, the gate electrodes 710 and the gate mask layer patterns 800. The insulating layer may include insulating material such as silicon nitride.

Thereafter, the insulating layer is anisotropically etched so that spacers 900 are formed on sidewalls of the gate mask layer patterns 800, the gate electrodes 710 and the gate oxide layer patterns 610. Thus, the semiconductor device including the dummy impurity regions 130, the active impurity regions 140, the gate oxide layer patterns 610, the gate electrodes 710, the gate mask layer patterns 800 and the spacers 900 may be fabricated.

According to the invention, a dummy region extends in a direction substantially perpendicular to a word line. Thus, leaning of the dummy region may be prevented.

In addition, the dummy region is not cut by an isolation layer pattern. Thus, a failure due to a migration of a void generated in a lower portion of a gate electrode, the lower portion being lodged into the dummy region, may be prevented.

The invention may be practiced in many ways. What follows are exemplary, non-limiting descriptions of some embodiments of the invention.

According to some embodiments, a semiconductor device includes a dummy region, active regions, an isolation layer pattern, gate electrodes, gate mask layer patterns and gate oxide layer patterns. The dummy region extends in a first direction. The dummy region includes an upper portion having first and third grooves extending in a second direction substantially perpendicular to the first direction. The third grooves are provided under the first grooves to be communicated with the first grooves. The dummy region includes an upper face portion doped with impurities.

The active regions include upper portions having second and fourth grooves extending in the second direction. The fourth grooves are provided under the second grooves to be communicated with the second grooves. The active region includes an upper face portion doped with impurities.

The isolation layer pattern is formed between the dummy region and the active regions and between the active regions. The isolation layer pattern insulates the dummy region from the active regions electrically. The isolation layer pattern electrically insulates the active regions from one another.

The gate electrodes each include first and second portions. The first portion extends in the second direction on the isolation layer pattern to fill the first and second grooves. The second portions are connected to the first portion. The second portions fill the third and fourth grooves. The second portion has a void. The gate mask layer patterns are formed on the gate electrodes. The gate oxide layer patterns are formed between the dummy region and the gate electrodes and between the active regions and gate electrodes.

In accordance with some embodiments of the invention, a method of fabricating the semiconductor device is provided. In the method, an isolation layer pattern exposing upper faces of active regions and a dummy region is formed. The active regions and the dummy region are formed at an upper portion of a semiconductor substrate. The dummy region extends in a first direction.

The first grooves and second grooves are formed at an upper portion of the dummy region and at upper portions of the active regions, respectively. The first grooves and second grooves extend in a second direction substantially perpendicular to the first direction.

Third grooves and fourth grooves are formed under the first grooves and the fourth grooves, respectively. The third grooves and the fourth grooves extend in the second direction. The third grooves and the fourth grooves are communicated with the first grooves and the second grooves, respectively. Gate oxide layers are formed on faces of the dummy region and the active regions. The faces are exposed by the isolation layer pattern.

A gate electrode layer including a first portion and second portions is formed. The first portion is formed on the isolation layer pattern and the gate oxide layers to fill the first and second grooves partially filled with the gate oxide layers. The second portions fill the third and fourth grooves. The second portion has a void.

Mask layer patterns extending in the second direction are formed on the gate electrode layer. The gate electrode layers and the gate oxide layers are etched by using the mask layer patterns together as an etch mask to form gate electrodes and gate oxide layer patterns, respectively. Portions of the dummy regions and the active regions, the portions being exposed by the gate oxide layer patterns, are doped with impurities.

According to some embodiments of the invention, a dummy region extends in a direction substantially perpendicular to a word line. Thus, leaning of the dummy region may be prevented. In addition, the dummy region is not cut by the isolation layer pattern. Thus, a failure due to migration of the void generated in the lower portion of the gate electrode, the lower portion being lodged into the dummy region, may be prevented.

The foregoing is illustrative of the invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A method of manufacturing a semiconductor device, the method comprising:

forming an isolation layer pattern exposing upper faces of active regions and a dummy region, the active regions and the dummy region being disposed at an upper portion of a semiconductor substrate, the dummy region extending in a first direction;

forming first grooves at an upper portion of the dummy region, the first grooves extending in a second direction substantially perpendicular to the first direction;

forming second grooves at upper portions of the active regions, the second grooves extending in the second direction;

forming third grooves under the first grooves, the third grooves extending in the second direction, the third grooves being communicated with the first grooves;

forming fourth grooves under the second grooves, the fourth grooves extending in the second direction, the fourth grooves being communicated with the second grooves;

forming gate oxide layers on faces of the dummy region and the active regions;

forming a gate electrode layer, the gate electrode layer including a first portion and a second portion, the first portion being disposed on the isolation layer pattern and the gate oxide layers to fill the first and second grooves, the second portion disposed on the isolation layer pattern and the gate oxide layers to fill the third and fourth grooves, the second portion having a void;

forming mask layer patterns extending in the second direction on the gate electrode layer;

etching the gate electrode layer and the gate oxide layers by using the mask layer patterns as an etch mask to form gate electrodes and gate oxide layer patterns, respectively; and doping impurities into portions of the dummy regions and the active regions, the portions being exposed by the gate oxide layer patterns.

2. The method of claim 1, wherein the dummy region is not cut by the isolation layer in the second direction.

3. The method of claim 1, wherein the third and fourth grooves are substantially symmetrical, and wherein the void is disposed at a center of the second portion.

4. The method of claim 1, wherein at least three gate electrode are disposed on the the dummy region.

5. The method of claim 1, further comprising forming spacers on sidewalls of the gate oxide layer patterns, the gate electrodes, and the gate mask layer patterns.

6. The method of claim 1, wherein forming the first grooves and forming the second grooves comprises anisotropically etching, and wherein forming the third grooves and forming the fourth grooves comprises isotropically etching.

7. The method of claim 1, wherein sidewalls of the first and second grooves are substantially vertical, and wherein sections of the third and fourth grooves taken along the first direction are substantially circular in shape.

8. A method of manufacturing a semiconductor device, the method comprising:

forming an isolation layer pattern exposing upper faces of active regions and a dummy region, the active regions and the dummy region being formed at an upper portion of a semiconductor substrate, the dummy region extending in a first direction;

forming first grooves and second grooves at an upper portion of the dummy region and upper portions of the active regions, respectively, the first grooves and second grooves extending in a second direction substantially perpendicular to the first direction;

forming third grooves and fourth grooves under the first grooves and under the fourth grooves, respectively, the third grooves and the fourth grooves extending in the second direction, the third grooves and the fourth grooves being communicated with the first grooves and the second grooves, respectively;

forming gate oxide layers on faces of the dummy region and the active regions, the faces being exposed by the isolation layer pattern;

forming a gate electrode layer including a first portion and second portions, the first portion being formed on the isolation layer pattern and the gate oxide layers to fill the first and second grooves partially filled with the gate oxide layers, the second portions filling the third and fourth grooves, the second portion having a void;

forming mask layer patterns extending in the second direction on the gate electrode layer;

etching the gate electrode layers and the gate oxide layers by using the mask layer patterns together as an etch mask to form gate electrodes and gate oxide layer patterns, respectively; and doping impurities into portions of the dummy regions and the active regions, the portions being exposed by the gate oxide layer patterns.

9. The method of claim 8, wherein the dummy region is not cut by the isolation layer pattern in the second direction.

10. The method of claim 8, wherein the third and fourth grooves are substantially symmetrical, the void being generated at a center of the second portion.

11. The method of claim 8, wherein at least three gate electrodes are formed on the dummy region.

12. The method of claim 8, further comprising forming spacers on sidewalls of the gate oxide layer patterns, the gate electrodes and the gate mask layer patterns.

13. The method of claim 8, wherein the first and second grooves are formed by an anisotropic etching process, and the third and fourth grooves are formed by an isotropic etching process; and wherein the first and second grooves having sidewalls that are substantially vertical, and sections of the third and fourth grooves taken along the first direction are substantially circular shapes.

* * * * *